United States Patent
He et al.

(10) Patent No.: US 12,521,760 B2
(45) Date of Patent: Jan. 13, 2026

(54) LOW-FREQUENCY COMPLEMENTARY METAL OXIDE SEMICONDUCTOR (CMOS) ULTRASONIC TRANSDUCER

(71) Applicant: TEXAS INSTRUMENTS INCORPORATED, Dallas, TX (US)

(72) Inventors: Yanbo He, Irvine, CA (US); Bichoy Bahr, Allen, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 843 days.

(21) Appl. No.: 17/682,576

(22) Filed: Feb. 28, 2022

(65) Prior Publication Data

US 2023/0271222 A1 Aug. 31, 2023

(51) Int. Cl.
    *B06B 1/02* (2006.01)
(52) U.S. Cl.
    CPC .................................. *B06B 1/0292* (2013.01)
(58) Field of Classification Search
    CPC ............................. B06B 1/0292; B06B 1/062
    See application file for complete search history.

(56) References Cited

U.S. PATENT DOCUMENTS

| 2006/0121203 | A1* | 6/2006 | Kimura | B01J 19/1887 427/532 |
| 2009/0250729 | A1* | 10/2009 | Lemmerhirt | A61B 8/00 257/254 |
| 2014/0219062 | A1* | 8/2014 | Rothberg | G10K 9/12 367/135 |
| 2014/0355381 | A1* | 12/2014 | Lal | H01J 49/025 327/356 |
| 2017/0207214 | A1* | 7/2017 | Or-Bach | H01L 25/117 |
| 2018/0277530 | A1* | 9/2018 | Or-Bach | H01L 21/304 |
| 2019/0172826 | A1* | 6/2019 | Or-Bach | H01L 23/5226 |
| 2019/0275561 | A1* | 9/2019 | Fife | B81C 1/00238 |
| 2020/0243487 | A1* | 7/2020 | Or-Bach | H01L 24/80 |
| 2021/0193655 | A1* | 6/2021 | Or-Bach | H10D 84/0149 |
| 2021/0206624 | A1* | 7/2021 | Silvestre | B81C 1/00182 |
| 2021/0404994 | A1* | 12/2021 | Pushparaj | B06B 1/0292 |

OTHER PUBLICATIONS

He, Yanbo et al., "A Ferroelectric Capacitor (FECAP) Based Unreleased Resonator," Jan. 13, 2020, Found online at: https://transducer-research-foundation.org/technical_digests/HiltonHead_2018/hh2018_0071.pdf.

* cited by examiner

*Primary Examiner* — Daniel L Murphy
*Assistant Examiner* — Amie M Ndure
(74) *Attorney, Agent, or Firm* — Frank D. Cimino

(57) ABSTRACT

In accordance with at least one example of the description, a device includes a substrate and a linear array of transducer elements across the substrate and forming a cavity region. The cavity region is bounded by a first termination region and a second termination region. The linear array of transducer elements includes a transducer element having a front-end-of-line (FEOL) portion that is formed by a FEOL process and a back-end-of-line (BEOL) portion that is formed by an n-layer BEOL process. The BEOL portion of the transducer element includes a ferroelectric capacitor and a conductive element. The conductive element is formed by metal layer-n of the n-layer BEOL process, where n denotes an integer greater than 3.

16 Claims, 14 Drawing Sheets

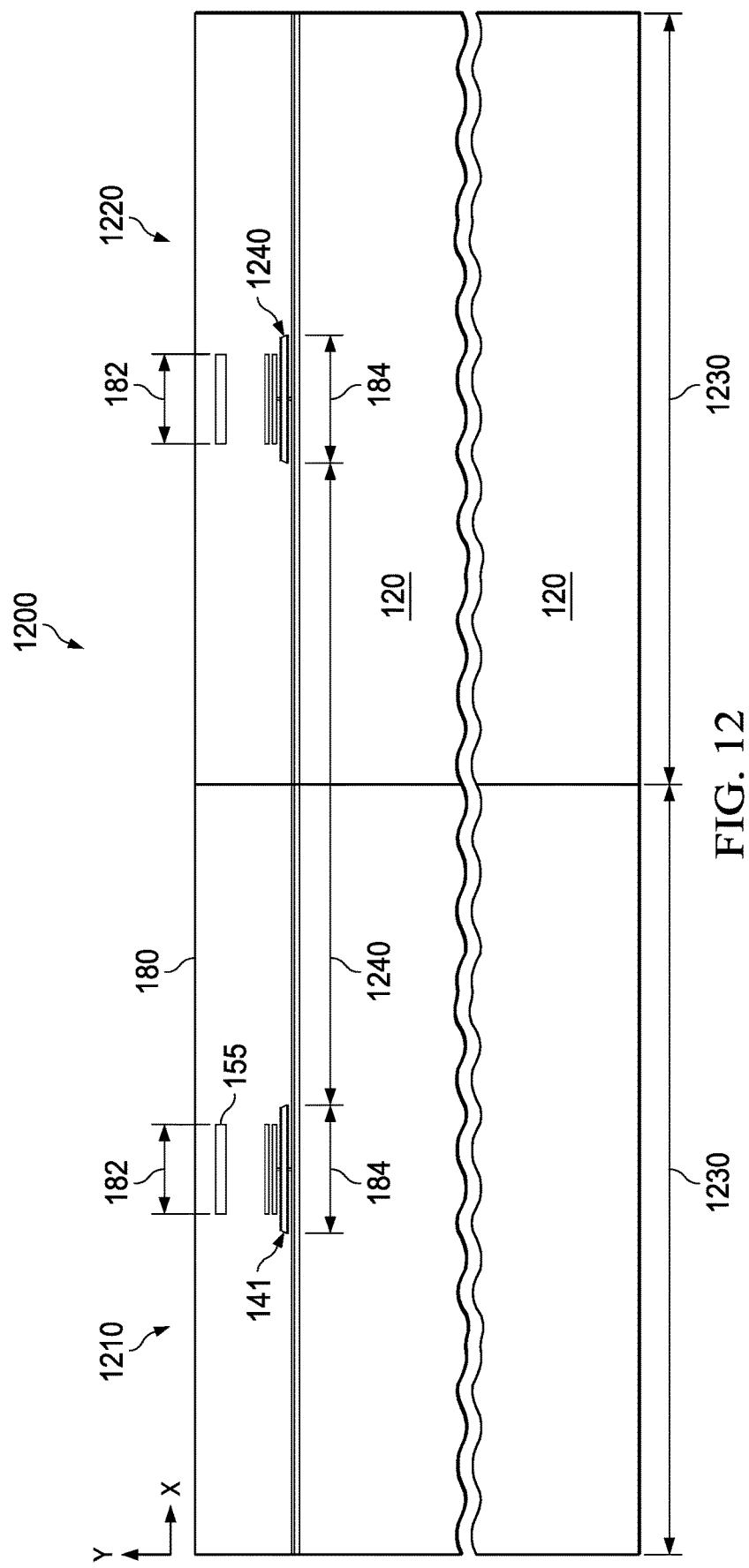

US 12,521,760 B2

LOW-FREQUENCY COMPLEMENTARY METAL OXIDE SEMICONDUCTOR (CMOS) ULTRASONIC TRANSDUCER

BACKGROUND

Ultrasonic transducers and sensors are acoustic devices divided into three broad categories: transmitters, receivers and transceivers. Transmitters convert electrical energy into acoustic energy, receivers convert acoustic energy into electrical energy, and transceivers can both transmit and receive acoustic energy. Ultrasonic transducers are useful in a wide range of applications such as applications that involve evaluating a target by transmitting acoustic energy towards the target and receiving acoustic energy reflected by the target. Such applications can include medical ultrasonic transducers that are useful for medical imaging, automobile sensors that are useful for providing driver assistance functionalities, biometric sensors that are useful for providing access control functionalities, and other applications in which evaluating targets with acoustic energy is useful.

SUMMARY

In accordance with at least one example of the description, a device includes a substrate and a linear array of transducer elements across the substrate and forming a cavity region. The cavity region is bounded by a first termination region and a second termination region. The linear array of transducer elements includes a transducer element having a front-end-of-line (FEOL) portion that is formed by a FEOL process and a back-end-of-line (BEOL) portion that is formed by an n-layer BEOL process. The BEOL portion of the transducer element includes ferroelectric capacitor and a conductive element. The conductive element is formed by metal layer-n of the n-layer BEOL process, where n denotes an integer greater than 3.

BRIEF DESCRIPTION OF THE DRAWINGS

FIG. 12 is a cross-sectional view of a portion of an IC device that includes transducer elements across the substrate that facilitate Rayleigh surface acoustic mode operation.

DETAILED DESCRIPTION

Some existing approaches for implementing ultrasonic transducers, such as piezoelectric micromachined ultrasound transducers (PMUTs) and capacitive micromachined ultrasonic transducers (CMUTs), fabricate an ultrasonic transducer array on a first substrate that is then bonded to a second substrate that includes an integrated circuit (IC) having electronic circuitry that is useful for controlling the array and forming a multi-chip module (MCM). This can result in complex packaging and integration issues such as increased routing parasitics. Another existing approach integrates an ultrasonic transducer array and electronic circuitry that is useful for controlling the array into a single substrate and forming an integrated circuit (IC). That existing approach involves the ultrasonic transducer array generating acoustic energy that propagates in-plane or laterally within the single substrate towards an antenna structure that radiates the acoustic energy into a surrounding medium.

Examples of this description provide for an IC device that includes a substrate and a linear array of transducer elements across the substrate and forming a cavity region. The linear array of transducer elements includes a transducer element having a front-end-of-line (FEOL) portion and a back-end-of-line (BEOL) portion. A ferroelectric capacitor of the BEOL portion is useful for converting electrical energy into acoustic energy or vice versa. A conductive element of the BEOL portion is useful for controlling a vibration mode in the BEOL portion. By controlling the vibration mode, the conductive element of the BEOL portion can facilitate radiating acoustic energy provided by the ferroelectric capacitor of the BEOL portion in a vertical direction away from the substrate without a separate antenna structure. In some examples, electronic circuitry (e.g., an excitation source) that is useful for controlling the linear array of transducer elements is on the substrate. Disposing linear array of transducer elements and such electronic circuitry on the same substrate can mitigate the complex packaging and integration issues involved in MCM integration.

Figure 1:
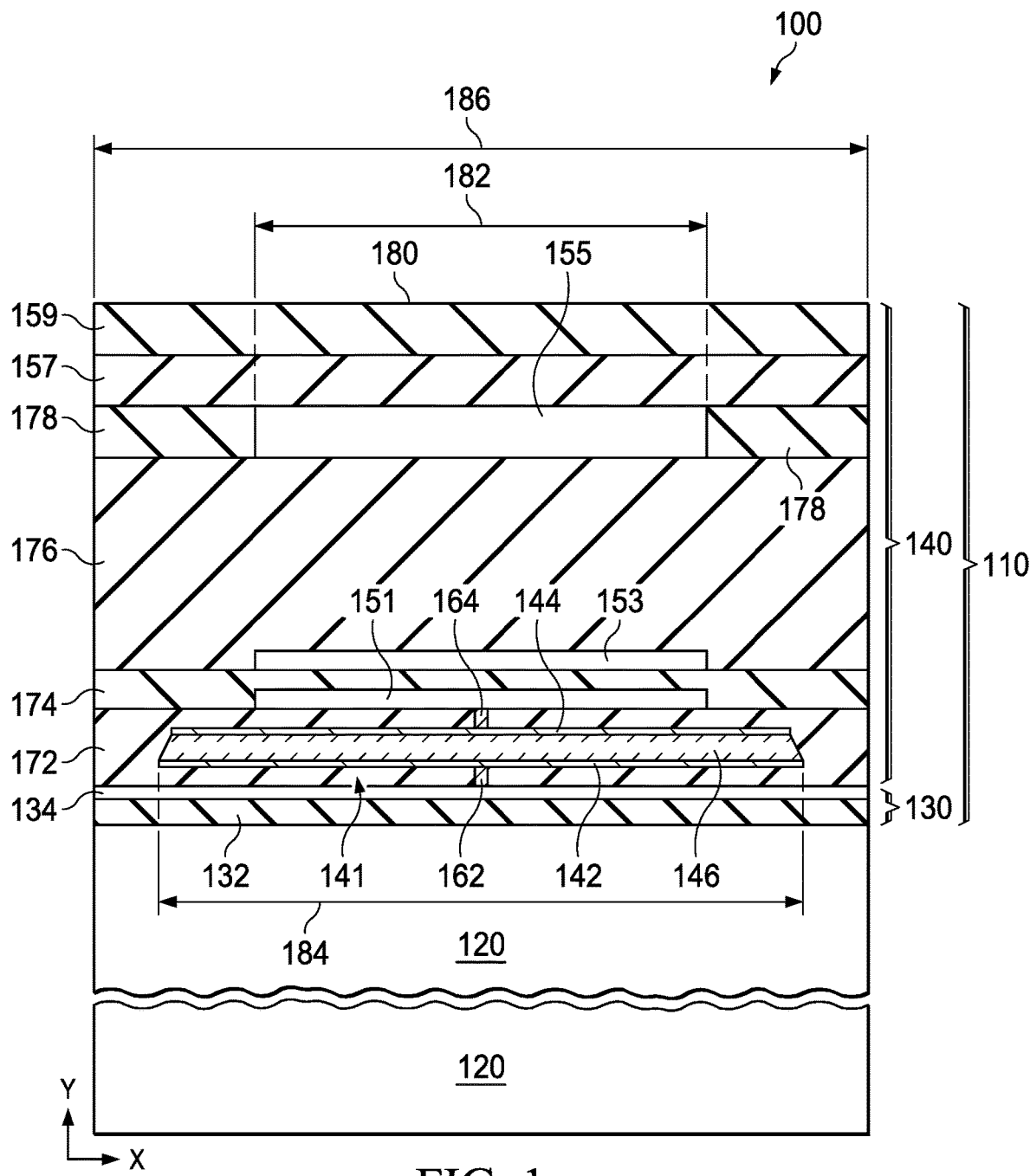
FIG. 1 is a cross-sectional view of a portion of an example integrated circuit (IC) device that includes a transducer element and a substrate.

FIG. 1 is a cross-sectional view of a portion of an example IC device 100 that includes a transducer element 110 and a substrate 120. In at least one example, the IC device 100 is formed on the substrate 120 by an IC fabrication process that includes a front-end-of-line (FEOL) process and a back-end-of-line (BEOL) process. The FEOL process is a first portion of the IC fabrication process where individual devices (e.g., transistors, capacitors, and/or resistors) are patterned in a semiconductor wafer. The BEOL process is a second portion of the IC fabrication process where metal layers and vias are deposited to interconnect the individual devices patterned during the FEOL process. Multiple metal layers can be deposited during the BEOL process. For example, a BEOL process can be a 6-layer BEOL process that involves sequentially depositing 6 metal layers. Inter-metal dielectric layers can be deposited during the BEOL process to electrically isolate adjacent metal layers (e.g., electrically isolate metal layer-1 from metal layer-2). The BEOL process can further involve forming one or more passivation layers (e.g., a silicon nitride layer and/or a silicon oxide layer) over metal layers and inter-metal dielectric layers deposited during the BEOL process to protect the IC device 100 from a surrounding environment.

The transducer element 110 includes a FEOL portion 130 that includes an oxide layer 132 and a polysilicon layer 134. The FEOL portion 130 can be formed by a FEOL process of an IC fabrication process that forms the IC device 100. The polysilicon layer 134 is adapted to be coupled to ground.

The transducer element 110 further includes a BEOL portion 140 that is spatially separated from the substrate 120 by the FEOL portion 130. The BEOL portion 140 can be formed by an n-layer BEOL process of the IC fabrication process that forms the IC 100, where n denotes an integer greater than 5. The BEOL portion 140 includes a ferroelectric capacitor 141. The ferroelectric capacitor 141 includes a first electrode 142 and a second electrode 144 formed from conductive material. The ferroelectric capacitor 141 further includes a dielectric element 146 between the first electrode 142 and the second electrode 144 and forming a capacitor configuration. The dielectric element 146 is formed from a ferroelectric material, such as lead zirconium titanate (PZT), barium titanate (BaTiO$_3$), barium strontium titanate (BST), lead titanate (PbTiO$_3$), hafnium dioxide (HfO$_2$), scandium doped aluminum nitride (AlScN), or other ferroelectric materials. A ferroelectric material can have a piezoelectric response where changing polarization within the ferroelectric material provides internal stress in the ferroelectric material by inducing dielectric dipole moment and changing the lattice constant.

The BEOL portion 140 also includes a first conductive element 151, a second conductive element 153, and a third conductive element 155. The first conductive element 151 can be formed by metal layer-m of the n-layer BEOL process, where m denotes an integer less than 3. The second conductive element 153 can be formed by metal layer-(m+1) of the n-layer BEOL process. In at least one example, the first conductive element 151 and the second conductive element 153 can be formed by metal layer-1 and metal layer-2 of the n-layer BEOL process, respectively. In at least one example, the second conductive element 153 is omitted. The third conductive element 155 can be formed by metal layer-n of the n-layer BEOL process. In at least one example, the n-layer BEOL process can be a 6-layer BEOL process, and the third conductive element 155 can be formed by metal layer-6 of the 6-layer BEOL process.

The BEOL portion 140 can further include a first passivation layer 157 and a second passivation layer 159. The first passivation layer 157 can be formed on the third conductive element 155, and the second passivation layer 159 can be formed on the first passivation layer 157 during the n-layer BEOL process. The first passivation layer 157 and/or the second passivation layer 159 can be formed by a dielectric material, such as an oxide of silicon (e.g., silicon dioxide (SiO$_2$)), silicon nitride (Si3N4), or another dielectric material.

The transducer element 110 further includes vias 162 and a second via 164. The first via 162 electrically couples the polysilicon layer 134 and the first electrode 142 of the ferroelectric capacitor 141. The second via 164 electrically couples the second electrode 144 of the ferroelectric capacitor 141 and the first conductive element 151. The transducer element 110 further includes a dielectric layer 172, a first inter-metal dielectric layer 174, a second inter-metal dielectric layer 176, and a third inter-metal dielectric layer 178. The dielectric layer 172, the first inter-metal dielectric layer 174, the second inter-metal dielectric layer 176, and/or the third inter-metal dielectric layer 178 can include a dielectric material such as an oxide of silicon (e.g., silicon dioxide (SiO$_2$)). The dielectric layer 172 electrically isolates the ferroelectric capacitor 141 from the polysilicon layer 134 and the first conductive element 151. The first inter-metal dielectric layer 174 electrically isolates the first conductive element 151 from the second conductive element 153. The second inter-metal dielectric layer 176 electrically isolates the second conductive element 153 from the third conductive element 155. The third inter-metal dielectric layer 178 electrically isolates the third conductive element 155 from elements laterally opposing (e.g., in the x-direction) the third conductive element 155. For example, the third inter-metal dielectric layer 178 can electrically isolate the third conductive element 155 from a conductive element of a neighboring transducer element (not shown) formed by metal layer-n of the n-layer BEOL process.

The transducer element 110 can represent a semiconductor or complementary metal oxide semiconductor (CMOS) stack that is formed on the substrate 120 by the IC fabrication process that forms the IC device 100. That semiconductor stack represented by the transducer element 110 extends vertically (e.g., in the y-direction) from the substrate to a stack surface 180. The stack surface 180 is spatially separated from the FEOL portion 130 of the transducer element 110 by the BEOL portion 140. The third conductive element 155 is configured to, responsive to receiving incident elastic energy, control a vibration mode of the BEOL portion 140. In at least one example, the first conductive element 151, the second conductive element 153, and the third conductive element 155 can laterally (e.g., in the x-direction) span an equivalent distance (e.g., 7 micron). Stated differently, the third conductive element 155 can have a width 182 that is equal to respective widths of the first conductive element 151 and the second conductive element 153. In at least one example, the width 182 of the third conductive element 155 can be different from a width of the first conductive element 151 and/or a width of the second conductive element 153. In at least one example, a width (e.g., 10 micron) of the first conductive element 151 and/or a width of the second conductive element 153 can be greater (e.g., 10 micron) than the width 182 (e.g., 8 micron) of the third conductive element 155. In at least one example, the width 182 of the third conductive element 153 can be greater (e.g., 11 micron) than a width (e.g., 9 micron) of the first conductive element 151 and/or a width (e.g., 10 micron) of the second conductive element 153. The ferroelectric capacitor 141 has a width 184 and the transducer element 110 has a pitch 186 (e.g., 12 micron) for neighboring transducer elements (not shown) on the substrate 120. In at least one example, the width 184 of the ferroelectric capacitor 141 and/or the pitch 186 of the transducer element 110 can determine an acoustic resonance frequency of a cavity region formed by disposing a linear array of transducer elements that includes the transducer element 110 across the substrate 120. In at least one example, the acoustic resonance frequency of the cavity region is dependent on a dimension (e.g., a thickness) of the transducer element 110 in a vertical direction (e.g., the y-direction). While three conductive elements are shown in FIG. 1, any number of conductive elements may compose the BEOL portion 140 of the transducer element 110. For example, the BEOL portion 140 of the transducer element 110 can include a lower number (e.g., two) conductive elements or a greater number (e.g., four) conductive elements.

Figure 2:
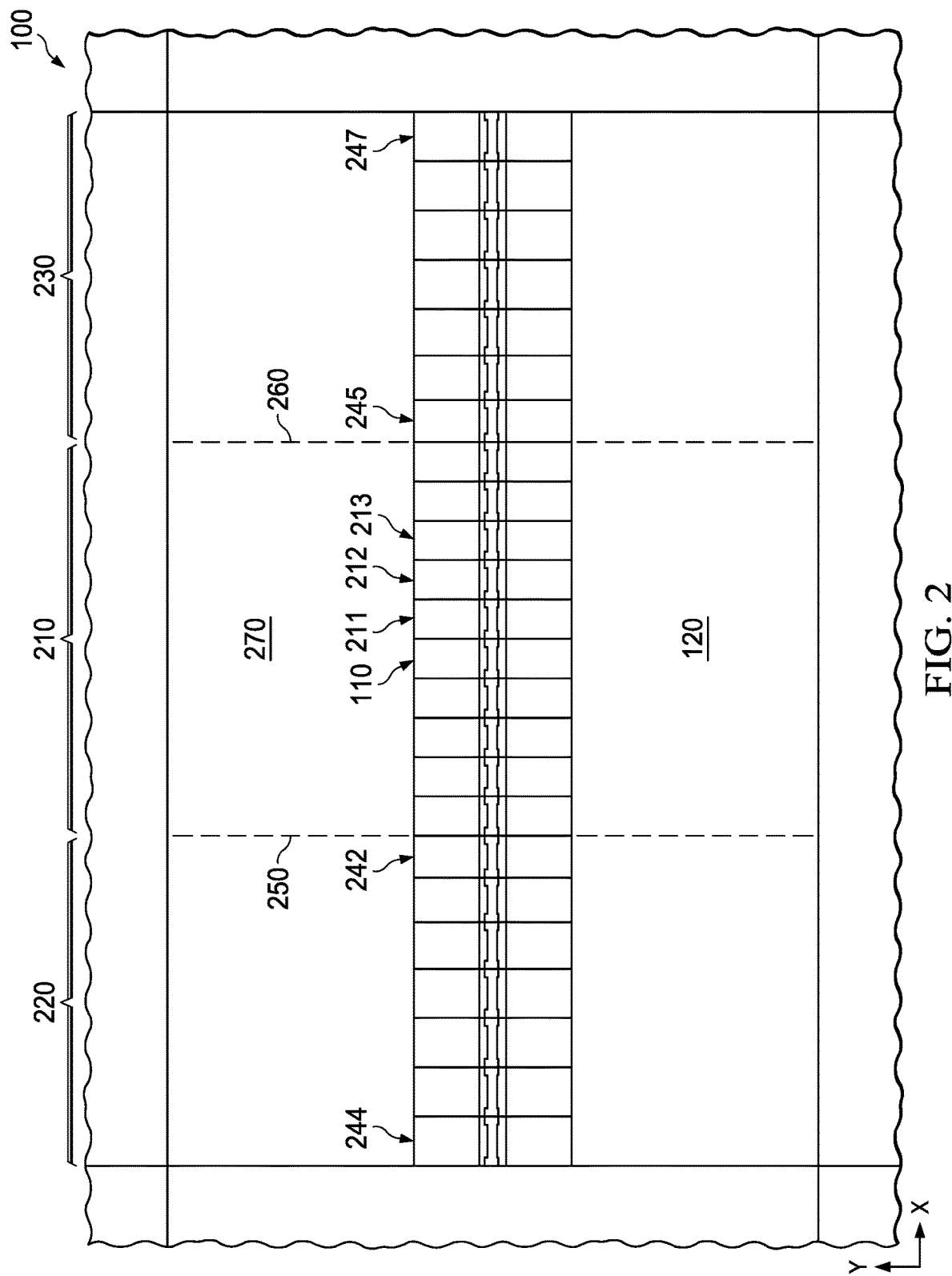
FIG. 2 is a cross-sectional view of the IC device having a linear array of transducer elements across the substrate and forming an ultrasonic transducer.

FIG. 2 is a cross-sectional view of an example implementation of the IC device 100 having a linear array of transducer elements and forming an ultrasonic transducer. The IC device 100 includes a cavity region 210 formed by a linear array of transducer elements (e.g., transducer elements 110, 211, 212, and 213) across the substrate 120. In FIG. 2, the transducer element 110 is representative of each transducer element that is in the cavity region 210 (e.g., transducer elements 211, 212, and 213). Stated differently, each transducer element in the cavity region 210 can be identical or substantially identical to the transducer element 110 in terms of geometric dimensions and structure. For example, each transducer element in the cavity region 210 can include a BEOL portion and a FEOL portion that are identical or substantially identical to the BEOL portion 140 and the FEOL portion 130 of the transducer element 110, respectively, in terms of geometric dimensions and structure. A wavelength of a surface acoustic wave inducible by exciting a resonance mode of the cavity region 210 is λ. Neighboring transducer elements (e.g., transducer elements 212 and 213) within the cavity region 210 can be spaced at a pitch or periodicity of λ/2. For example, the neighboring transducer elements within the cavity region 210 can be spaced at the pitch 186 of the transducer element 110. Non-neighboring transducer elements (e.g., transducer elements 110 and 212) within the cavity region 210 can be spaced at a pitch of λ. For example, the non-neighboring transducer elements within the cavity region 210 can be spaced at twice the pitch 186 of the transducer element 110.

The cavity region 210 of the IC device 100 is bounded by a first termination region 220 and a second termination region 230. The first termination region 220 includes a first linear array of termination elements (e.g., termination elements 242 and 244) across the substrate 120. The second termination region 230 includes a second linear array of termination elements (e.g., termination elements 245 and 247) across the substrate 120. An acoustic impedance of each termination region (e.g., the first termination region 220 and the second termination region 230) can be different from an acoustic impedance of the cavity region 210 such that an acoustic impedance mismatch exists between that termination region and the cavity region 210. Accordingly, an acoustic impedance of the first termination region 220 can be different from an acoustic impedance of the cavity region 210 such that an acoustic impedance mismatch exists at a first interface 250 between the first termination region 220 and the cavity region 210. Likewise, an acoustic impedance of the second termination 230 can be different from the acoustic impedance of the cavity region 210 such that an acoustic impedance mismatch exists at a second interface 260 between the second termination region 230 and the cavity region 210. Providing an acoustic impedance mismatch between the cavity region 210 and a given termination region can reduce propagation of elastic energy from the cavity region 210 into the given termination region. Reducing that propagation of the elastic energy can increase confinement of the elastic energy within the cavity region 210. In at least one example, reducing that propagation of the elastic energy can increase an efficiency of transducer elements (e.g., transducer elements 110, 211, 212, and 213) within the cavity region 210 by increasing a portion of the elastic energy that is radiated in a vertical direction (e.g., the y-direction) towards the stack surface 180.

Termination elements (e.g., termination elements 242, 244, 245, and 247) in the first termination region 220 and the second termination region 230 can be similar to transducer elements (e.g., transducer elements 110, 211, 212, and 213) within the cavity region 210 in terms of geometric dimensions and structure. Creating an acoustic impedance mismatch between a given termination region and the cavity region 210 can involve varying at least one geometric dimension (e.g., a width, a thickness, and/or a pitch) of a termination element composing the given termination region with respect to a corresponding geometric dimension of a transducer element composing the cavity region 210. For example, termination element 242 can include a conductive element that is formed by metal layer-n of the n-layer BEOL process that forms conductive element 155 of the transducer element 110. In this example, creating an acoustic impedance mismatch between the first termination region 220 and the cavity region 210 can involve varying (e.g., increasing or decreasing) a width of that conductive element composing the termination element 242 relative to a width of conductive element 155. As another example, termination element 245 can include a ferroelectric capacitor like the ferroelectric capacitor 141 of the transducer element 110. In this example, creating an acoustic impedance mismatch between the second termination region 230 and the cavity region 210 can involve varying (e.g., increasing or decreasing) a width of that ferroelectric capacitor composing the termination element 245 relative to the width 184 of the ferroelectric capacitor 141.

In at least one example, creating an acoustic impedance mismatch between a given termination region and the cavity region 210 can involve gradually varying a particular geometric dimension of termination elements composing the given termination region relative to a corresponding geometric dimension of a transducer element composing the cavity region 210. For example, transducer elements within the cavity region 210 can each include the pitch 186 of the transducer element 110. In this example, a pitch of termination elements within the first termination region 220 can gradually increase such that a pitch of termination element 242 is both greater than the pitch 186 and less than a pitch of termination element 244, as shown by FIG. 2. In at least one example, gradually increasing a pitch of termination elements within a termination region (e.g., the first termination region 220) can facilitate reducing scattering and/or radiation of elastic energy at an edge of the termination region.

Creating an acoustic impedance mismatch between a given termination region and the cavity region 210 can also involve varying a structure of a termination element composing the given termination relative to a structure of transducer elements within the cavity region 210. For example, a BEOL portion of a termination element within the first termination region 220 can include an additional conductive element formed by metal layer-(n−1) of the n-layer BEOL process that forms BEOL portion 140 of the transducer element 110. As another example, a BEOL portion of a termination element within the second termination region 230 can lack a conductive element that corresponds to the conductive element 153 of the transducer element 110.

The IC device 100 also includes packaging material 270 on the transducer elements forming the cavity region 210. The packaging material 270 is also on the termination elements forming the first termination region 220 and the second termination region 230. The packaging material 270 represents material that is introduced by an IC packaging process of the IC fabrication process that forms the IC device 100. The packaging material 270 can include potting compound material, conformal coating material, housing material (e.g., plastic) of a chip carrier, and/or other packaging materials that are introduced by an IC packaging process.

Figure 3A:
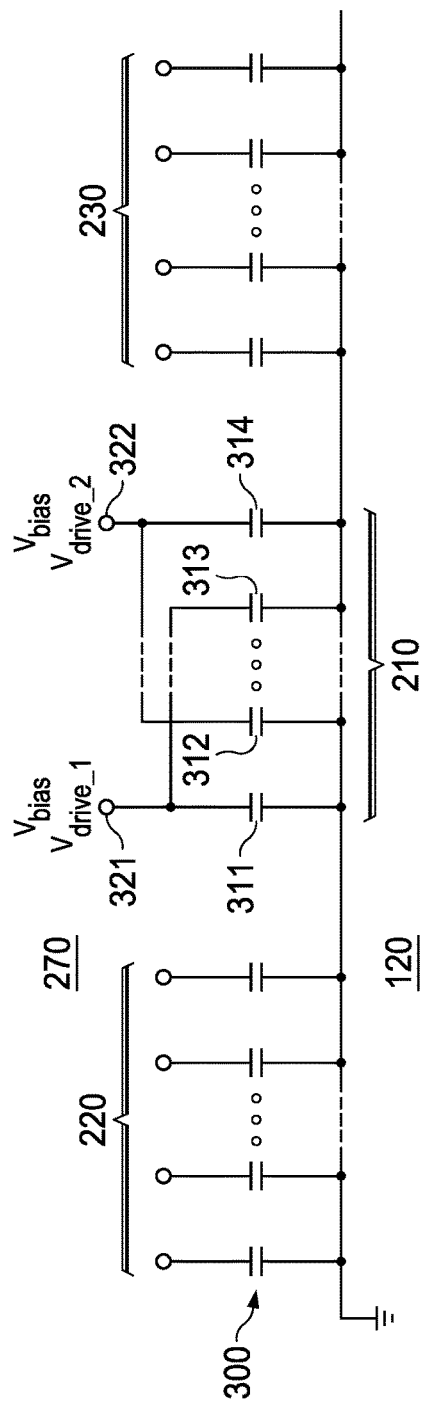
FIG. 3A is a schematic diagram of an example connection arrangement for a linear array of ferroelectric capacitors across the substrate of the IC device.
Figure 3B:
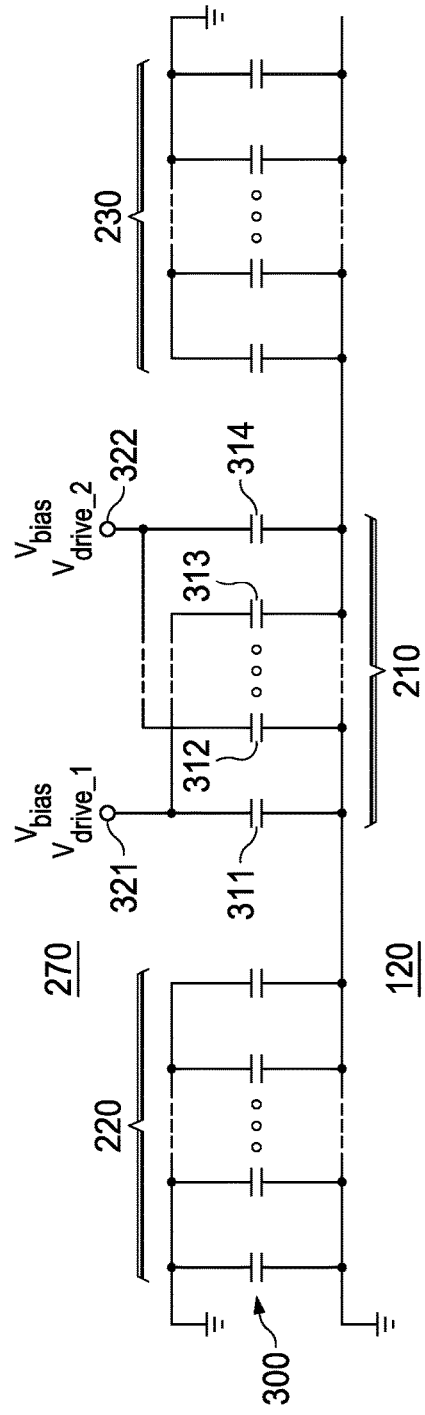
FIG. 3B is a schematic diagram of another example connection arrangement for the linear array of ferroelectric capacitors.

In at least one example, the IC device 100 includes a linear array of ferroelectric capacitors 300 across the cavity region 210, the first termination region 220, and the second termination region 230. FIG. 3A and FIG. 3B are schematic diagrams of example connection arrangements for the linear array of ferroelectric capacitors 300. In FIG. 3A and FIG. 3B, each ferroelectric capacitor in the linear array of ferroelectric capacitors 300 includes an electrode positioned proximate the substrate 120 and an electrode positioned proximate the packaging material 270. The electrode in each ferroelectric capacitor in the linear array of ferroelectric capacitors 300 that is positioned proximate the substrate 120 is described herein as a bottom electrode. The electrode in each ferroelectric capacitor in the linear array of ferroelectric capacitors 300 that is positioned proximate the packaging material 270 is described herein as a top electrode. In FIG. 3A and FIG. 3B, the bottom electrode of each ferroelectric capacitor in the linear array of ferroelectric capacitors 300 is adapted to be coupled to ground. In at least one example, the bottom electrode of each ferroelectric capacitor in the linear array of ferroelectric capacitors 300 is adapted to be coupled to ground via a silicon layer (e.g., the polysilicon layer 134 of FIG. 1). In FIG. 3A, the top electrode of each ferroelectric capacitor within the first termination region 220 and the second termination region 230 are adapted to be left floating with respect to ground. In FIG. 3B, the top electrode of each ferroelectric capacitor within the first termination region 220 and the second termination region 230 are adapted to be coupled to ground.

Within the cavity region 210, FIG. 3A and FIG. 3B each show the linear array of ferroelectric capacitors 300 as including ferroelectric capacitors 311, 312, 313, and 314. Ferroelectric capacitor 311 can represent the ferroelectric capacitor 141 of the transducer element 110. Ferroelectric capacitor 312 can represent a ferroelectric capacitor of the transducer element 211. Ferroelectric capacitor 313 can represent a ferroelectric capacitor of the transducer element 212. Ferroelectric capacitor 314 can represent a ferroelectric capacitor of the transducer element 213. A pair of excitation source terminals 320 include a first excitation source terminal 321 and a second excitation source terminal 322 that are adapted to be coupled to an excitation source (not shown). In at least one example, the excitation source is on the substrate 120.

A poling voltage (Vbias) from the excitation source can exist at the first excitation source terminal 321 and the second excitation source terminal 322. Vbias is a direct current (DC) voltage that modifies an operational state of a given transducer element. Responsive to Vbias existing at a top electrode of a ferroelectric capacitor composing the given transducer element, the operational state of the given transducer element is an active state. In the active state, the given transducer element turns on to convert electrical energy to acoustic energy or vice versa. Absence of Vbias at the top electrode of the ferroelectric capacitor composing the given transducer element, the operational state of the given transducer element is an inactive state. In the inactive state, the given transducer element turns off and does not convert electrical energy to acoustic energy or vice versa.

A first excitation signal ($V_{drive\_1}$) of a differential pair of excitation signals from the excitation source can exist at the first excitation source terminal 321. A second excitation signal ($V_{drive\_2}$) of the differential pair of excitation signals from the excitation source can exist at the second excitation source terminal 322. In at least one example, $V_{drive\_1}$ is a positive excitation signal and $V_{drive\_2}$ is a negative excitation signal. In at least one example, $V_{drive\_1}$ and $V_{drive\_2}$ are alternating current (AC) voltage signals having a common magnitude and operating frequency (e.g., an operating frequency between 240 megahertz (MHz) and 1.18 gigahertz (GHz)) but different phases. For example, $V_{drive\_1}$ and $V_{drive\_2}$ can be AC voltage signals having a common magnitude and operating frequency that are 180 degrees out-of-phase. In at least one example, $V_{drive\_1}$ is an AC voltage signal, and $V_{drive\_2}$ can have a zero-reference voltage level (e.g., the second excitation source terminal 322 can be tied to ground). In at least one example, $V_{drive\_1}$ is an AC voltage signal, and $V_{drive\_2}$ can have a floating-reference voltage level (e.g., the second excitation source terminal 322 can be floating with respect to ground).

FIG. 3A and FIG. 3B show that the top electrodes of neighboring ferroelectric capacitors within the cavity region 210 are adapted to be coupled to different excitation source terminals of the pair of excitation source terminals 320. For example, the top electrode of the ferroelectric capacitor 311 is adapted to be coupled to the first excitation source terminal 321, and the top electrode of the ferroelectric capacitor 312 is adapted to be coupled to the second excitation source terminal 322. FIG. 3A and FIG. 3B also show that the top electrodes of non-neighboring ferroelectric capacitors within the cavity region 210 are adapted to be coupled to the same excitation source terminal of the pair of excitation source terminals 320. For example, the top electrodes of ferroelectric capacitors 311 and 313 are each adapted to be coupled to the first excitation source terminal 321. As another example, the top electrodes of ferroelectric capacitors 312 and 314 are each adapted to be coupled to the second excitation source terminal 322. In at least one example, the pair of excitation source terminals 320 are adapted to be coupled to the top electrodes of ferroelectric capacitors within the cavity region 210 by conductive elements (e.g., conductive element 151 of the transducer element 110) formed by metal layer-m of the n-layer BEOL process that forms BEOL portion 140 of the transducer element 110.

To the extent that the top electrodes of ferroelectric capacitors within the cavity region 210 are adapted to be coupled to the pair of excitation source terminals 320, the ferroelectric capacitors within the cavity region 210 are adapted to be electrically coupled to the excitation source. To the extent that ferroelectric capacitors within the first terminal region 220 and the second terminal region 230 lack any electrode that is adapted to be coupled to the pair of excitation source terminals 320, the ferroelectric capacitors within the first terminal region 220 and the second terminal region 230 are adapted to be electrically isolated from the excitation source.

Figure 4:
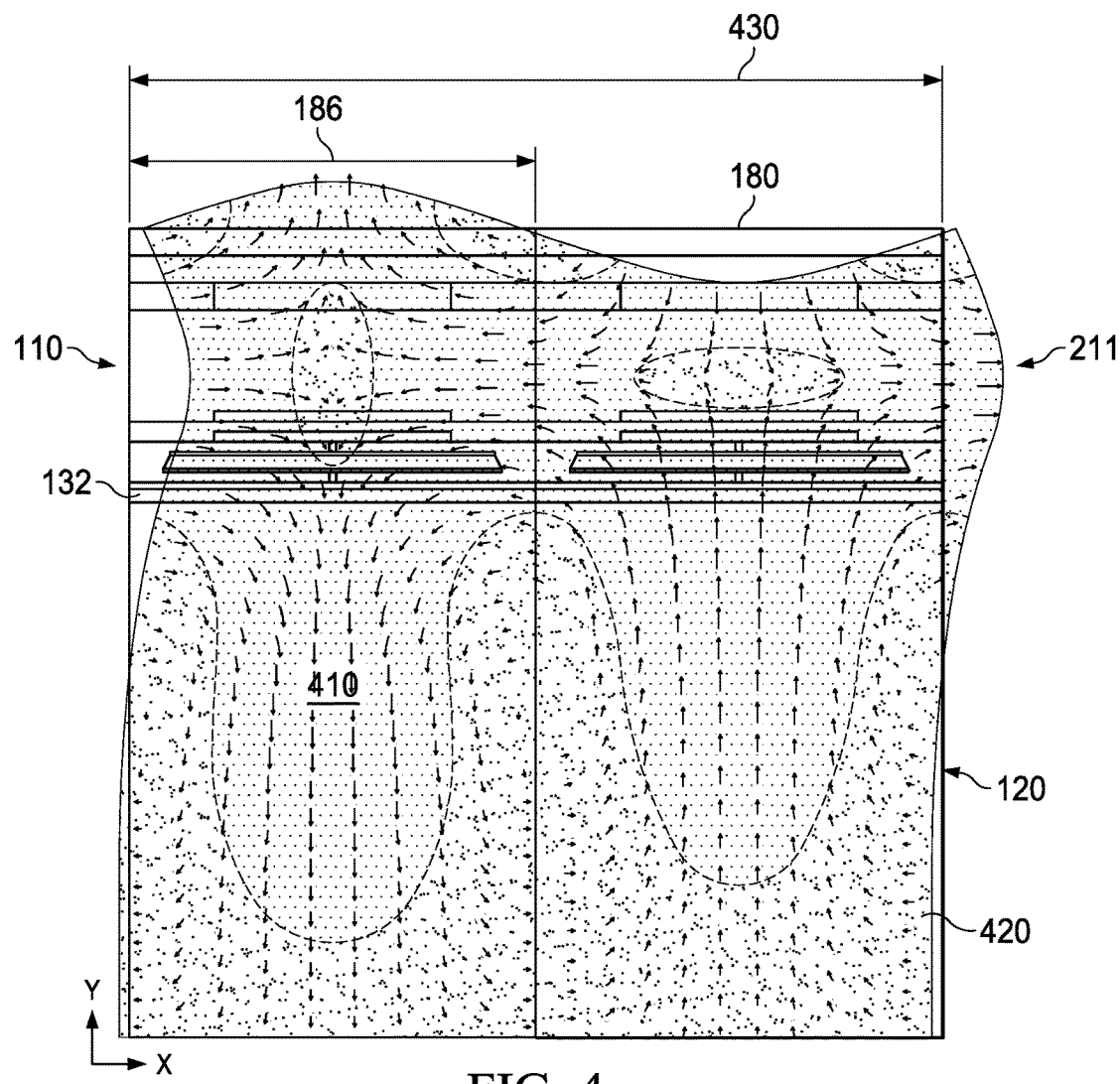
FIG. 4 is a cross-sectional view of a mechanical mode shape analysis for neighboring transducer elements of the IC device.

FIG. 4 is a cross-sectional view of a mechanical mode shape analysis for neighboring transducer elements of the IC device 100. The view of FIG. 4 shows a mechanical mode shape 400 obtained for the transducer element 110 and the transducer element 211 at a selected operating frequency (e.g., an operating frequency between 240 MHz and 1.18 GHZ) that excites a resonance mode of the cavity region 210. Regions 410 and 420 of the mechanical mode shape 400 represent positive elastic energy and negative elastic energy, respectively, that exists responsive to the resonance mode of the cavity region 210 being excited. The mechanical mode shape 400 shows that a structure of transducer elements (e.g., transducer elements 110 and 211) forming the cavity region 210 can facilitate mechanical vibration of an entire BEOL bulk structure. For example, region 410 extends from at least the oxide layer 132 to the stack surface 180. The mechanical mode shape 400 also shows that the structure of the transducer elements forming the cavity region 210 can facilitate inducing a surface acoustic wave at the stack surface 180 responsive to exciting the resonance mode of the cavity region 210. In FIG. 4, a wavelength 430 of the surface acoustic wave inducible by exciting the resonance mode of the cavity region 210 is equal to twice the pitch 186 of the transducer element 110.

Figure 5:
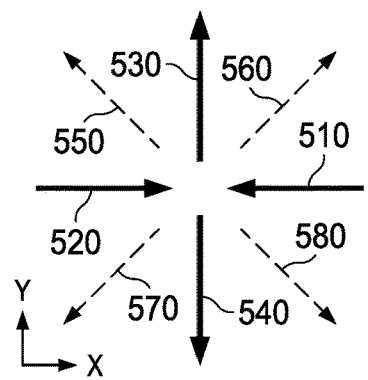
FIG. 5 is a diagram of expected wave motion of acoustic energy radiated by a transducer element responsive to stress imparted by the neighboring transducer elements of the IC device.

FIG. 5 is a diagram of expected wave motion of acoustic energy radiated by the transducer element 110 responsive to tensile stress imparted by neighboring transducer elements. From the displacement field of the mechanical mode shape shown in FIG. 4, a tensile stress exists at the transducer element 110 in a lateral orientation (e.g., an orientation in parallel with the x-direction). That tensile stress arises from tensile stress (represented by arrow 510) that the transducer element 211 imparts on a first side of the transducer element 110 and from tensile stress (represented by arrow 520) that a neighboring transducer element (not shown) imparts on a second side of the transducer element 110 that laterally opposes the first side. Responsive to the tensile stress 510 and the tensile stress 520, a tensile stress (represented by arrows 530 and 540) exists at the transducer element 110 in a vertical orientation (e.g., an orientation in parallel with the y-direction). Such tensile stress existing at the transducer element 110 provide acoustic signal waves at the transducer element 110 that radiate at angles with respect to a vertical direction (e.g., the y-direction). The provided acoustic signal waves include acoustic signal waves (represented by arrows 550 and 560) that radiate in the vertical direction away from the substrate 120. The generated acoustic signal waves also include acoustic signal waves (represented by arrows 570 and 580) that radiate in the vertical direction towards the substrate 120.

Figure 6:
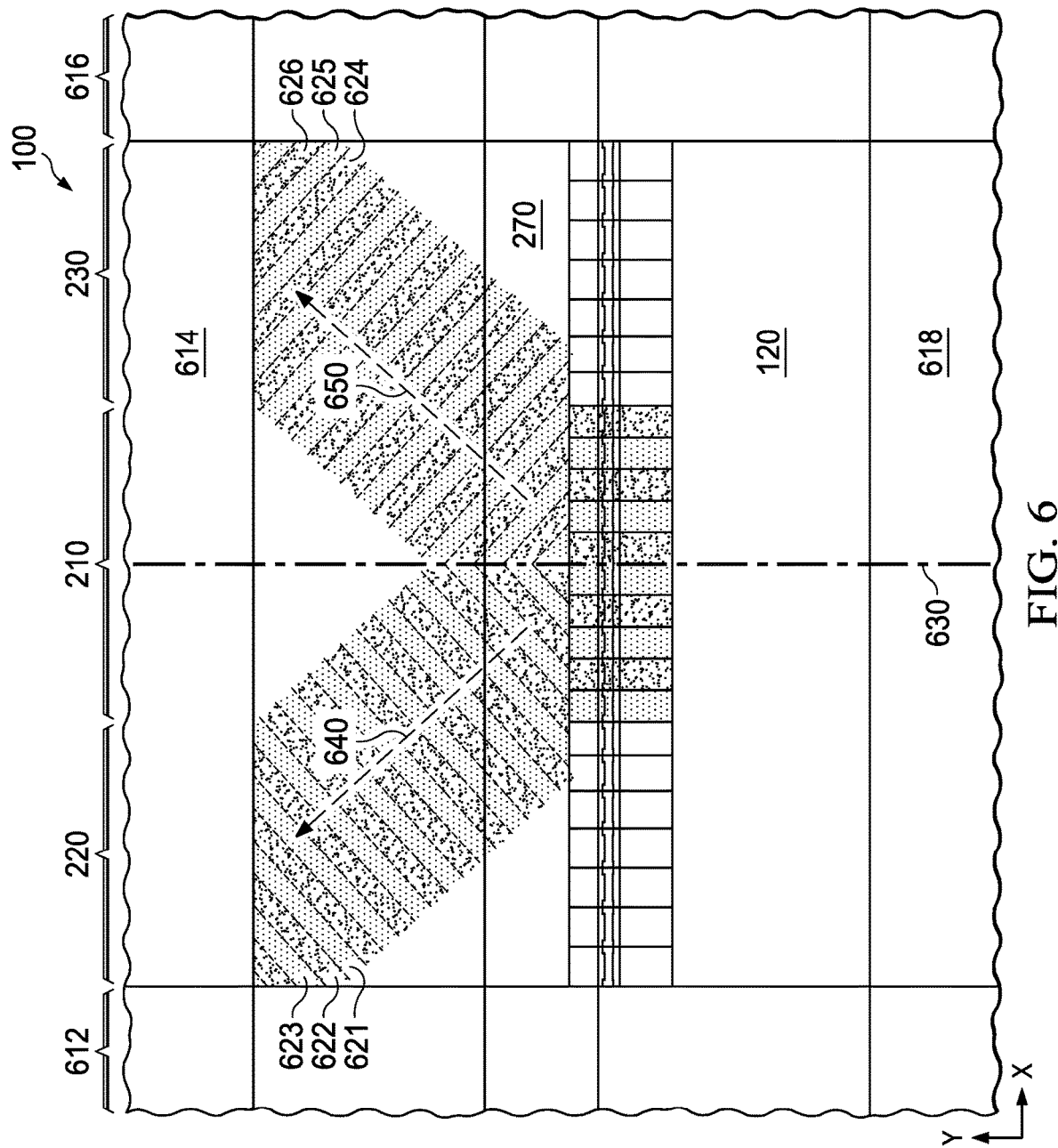
FIG. 6 is a cross-sectional view showing simulated operation of the IC device at a selected operating frequency of approximately 240 megahertz (MHz).

FIG. 6 is a cross-sectional view showing simulated operation of the IC device 100 at a selected operating frequency of approximately 240 MHz. A numerical finite element method (FEM) simulation tool is useful for performing such simulated operation. For the simulated operation shown in FIG. 6, the IC device 100 is bounded by regions 612, 614, 616, and 618 that represent perfectly matched layers (PMLs). PMLs (e.g., PMLs 612, 614, 616, and 618) have respective simulated properties that match the mechanical and material properties of adjacent structures. For example, PML 614 matches the packaging material 270 above the cavity region 210, the first termination region 220, and the second termination region 230. As another example, PML 618 matches the substrate 120 below the cavity region 210, the first termination region 220, and the second termination region 230. In at least one example, PMLs are useful in preventing or reducing reflections from structure boundaries during simulated operation to facilitate examining intrinsic behavior of a transducer without an impact of a limited simulation geometrical domain. In FIG. 6, ferroelectric capacitors of transducer elements (e.g., transducer elements 110 and 211) forming the cavity region 210 receive a differential pair of excitation signals (e.g., $V_{drive\_1}$ and $V_{drive\_2}$) having the selected operating frequency from an excitation source. The transducer elements forming the cavity 210 are configured to, responsive to the ferroelectric capacitors receiving the differential pair of excitation signals, radiate acoustic energy that propagates in a vertical direction (e.g., the y-direction) away from the substrate 120.

One aspect of radiating such acoustic energy can involve the ferroelectric capacitors generating internal stress to convert electrical energy of the differential pair of excitation signals into elastic energy. That elastic energy can be received as incident elastic energy by a conductive element (e.g., the conductive element 155 of the transducer element 110) formed by metal layer-n of the n-layer BEOL process that forms a BEOL portion of a transducer element within the cavity region 210. That conductive element is configured to, responsive to receiving the incident elastic energy, control a vibration mode of the BEOL portion such that the entire BEOL portion vibrates. Controlling the vibration mode can facilitate generating the radiated acoustic energy that propagates in the vertical direction. Signal wave elements 621, 622, 623, 624, 625, and 626 are representative of the radiated acoustic energy that propagates in the vertical direction. Constructive interference existing along a midline 630 of the cavity region 210 can partition the radiated acoustic energy into a pair of acoustic energy beams (represented by arrows 640 and 650) that propagate in opposing lateral directions with respect to the vertical direction. Acoustic signal wave elements 621, 622, and 623 compose a first acoustic beam 640 of the pair of acoustic energy beams. Acoustic signal wave elements 624, 625, and 626 compose a second acoustic beam 650 of the pair of acoustic energy beams. In at least one example, acoustic signal wave elements (e.g., acoustic signal wave elements 621, 622, and 623) composing an acoustic beam (e.g., the first acoustic beam 640) of the pair of acoustic energy beams are analogous to alternating peaks and dips of a sine wave.

Figure 7:
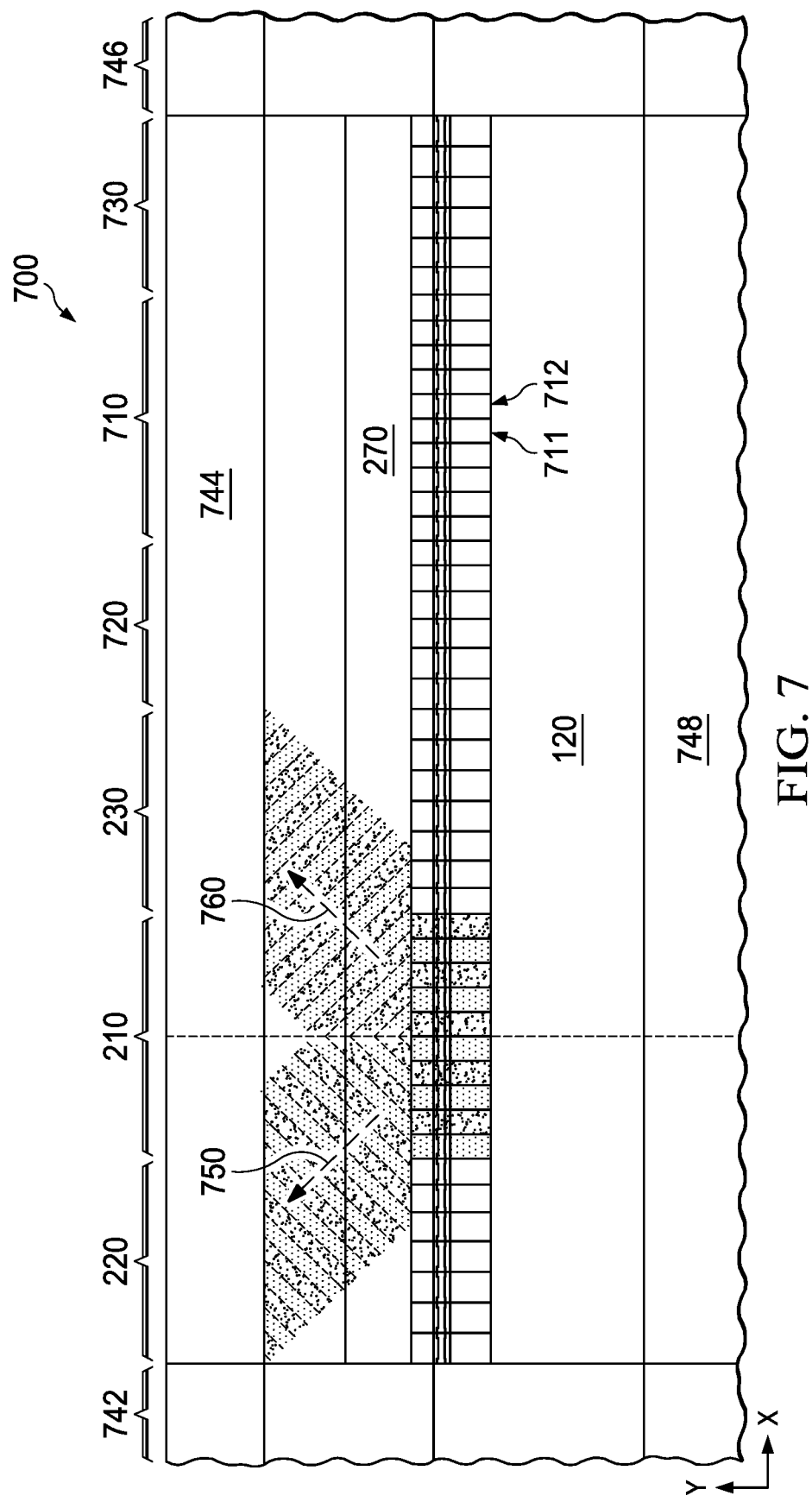
FIG. 7 is a cross-sectional view showing simulated operation of an example IC device having more than one linear array of transducer elements across the substrate and forming ultrasonic transducers.
Figure 8:
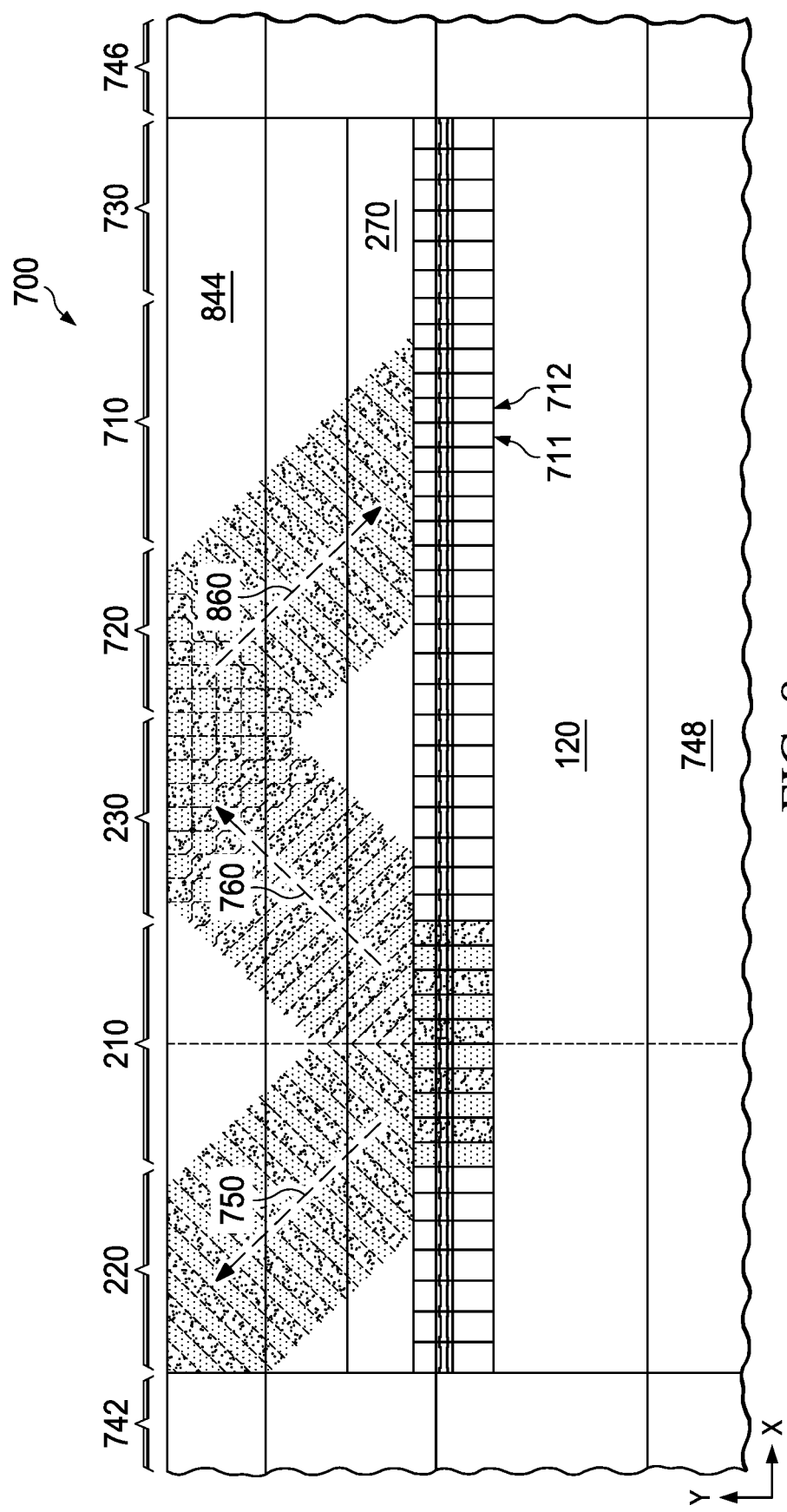
FIG. 8 is another cross-sectional view showing simulated operation of the IC device of FIG. 7.

FIG. 7 and FIG. 8 are cross-sectional views showing simulated operation of an example implementation of an IC device 700 having more than one linear array of transducer elements across the substrate 120 and forming ultrasonic transducers. The IC device 700 includes the cavity region 210 formed by a first linear array of transducer elements (e.g., transducer elements 110, 211, 212, and 213) across the substrate 120. The first linear array of transducer elements that form the cavity region 210 are configured to operate in a transmit mode. The IC device 700 also includes a second linear array of transducer elements (e.g., transducer elements 711 and 712) across the substrate 120 and forming a cavity region 710. Each transducer element in the cavity region 710 can be identical or substantially identical to the transducer element 110 of the cavity region 210 in terms of geometric dimensions and structure. The second linear array of transducer elements that form the cavity region 710 are configured to operate in a receive mode such that transducer elements within the cavity region 710 convert acoustic energy into electrical energy representative of the acoustic energy. The cavity region 710 of the IC device 700 is bounded by a third termination region 720 and a fourth termination region 730. The third termination region 720 and the fourth termination region 730 can be identical or substantially identical to the first termination region 220 and/or the second termination region 230 in terms of geometric dimensions and structure.

One aspect of converting acoustic energy into electrical energy can involve a conductive element (e.g., the conductive element 155 of the transducer element 110) formed by metal layer-n of the n-layer BEOL process that forms a BEOL portion of a transducer element within the cavity region 710 receiving incident elastic energy. The incident elastic energy can be provided by acoustic energy interacting with a stack surface (e.g., the stack surface 180) of that transducer element. Such acoustic energy can be acoustic energy radiated by transducer elements within the cavity region 210. That conductive element of the transducer element within the cavity region 710 is configured to, responsive to receiving the incident elastic energy, control a vibration mode of the BEOL portion such that the entire BEOL portion vibrates. Such vibrations can propagate as elastic energy to a ferroelectric capacitor within a FEOL portion of that transducer element. The transducer element is configured to, responsive to the ferroelectric capacitor receiving a DC voltage (e.g., Vbias) from an excitation source, convert elastic energy received from the BEOL portion into an electrical signal representative of the acoustic energy interacting with the stack surface.

For the simulated operation shown in FIG. 7, the IC device 700 is bounded by regions 742, 744, 746, and 748 that represent PMLs. For the simulated operation shown in FIG. 8, the PML 744 is replaced with a region 844 that represents a free boundary condition (FBC). An FBC has simulated properties such that an acoustic impedance mismatch exists between the free boundary condition and an adjacent structure. An FBC can simulate an interface between an adjacent structure (e.g., the packaging material 270) and a surrounding medium (e.g., air or a vacuum). In FIG. 7 and FIG. 8, ferroelectric capacitors of transducer elements forming the cavity region 210 receive a differential pair of excitation signals (e.g., $V_{drive\_1}$ and $V_{drive\_2}$) having the selected operating frequency from an excitation source. The transducer elements forming the cavity 210 are configured to, responsive to the ferroelectric capacitors receiving the differential pair of excitation signals, radiate acoustic energy that propagates in a vertical direction (e.g., the y-direction) away from the substrate 120. The radiated acoustic energy includes a pair of acoustic energy beams (represented by arrows 750 and 760) that propagate in opposing lateral directions with respect to the vertical direction. In FIG. 7, the PML 744 absorbs all of the acoustic energy radiated by the transducer elements forming the cavity region 210 such that none of that acoustic energy is reflected towards the transducer elements forming the cavity region 710. In FIG. 8, the FBC 844 reflects the acoustic energy radiated by the transducer elements forming the cavity region 210 towards the transducer elements forming the cavity region 710. The reflected acoustic energy includes an acoustic energy beam (represented by arrow 860) that interacts with a stack surface of the transducer elements forming the cavity region 710. The transducer elements forming the cavity region 710 can convert the reflected acoustic energy into an electrical signal representative of the reflected acoustic energy. In at least one example, the electrical signal can be processed by CMOS circuitry (not shown) on the substrate. A comparison between FIG. 7 and FIG. 8 shows that the IC device 700 is useful for performing sensor functions such as to detect the presence or absence of an object (e.g., a finger) proximate the packaging material 270. FIG. 7 represents a simulated operation responsive to the object being absent, and FIG. 8 represents a simulated operation responsive to the object being present.

In FIG. 6, FIG. 7, and FIG. 8, the cavity region 210 includes ten—an even number—of transducer elements. A cavity region (e.g., the cavity region 210) having an even number of transducer elements is a balanced cavity region. One half (e.g., five) of the transducer elements composing a balanced cavity region are adapted to be coupled to one excitation source terminal (e.g., the first excitation source terminal 321 of the pair of excitation source terminals 320) of a pair of excitation source terminals. Another half (e.g., five) of the transducer elements composing the balanced cavity region are adapted to be coupled to another excitation source terminal (e.g., the second excitation source terminal 322) of the pair of excitation source terminals.

Figure 9:
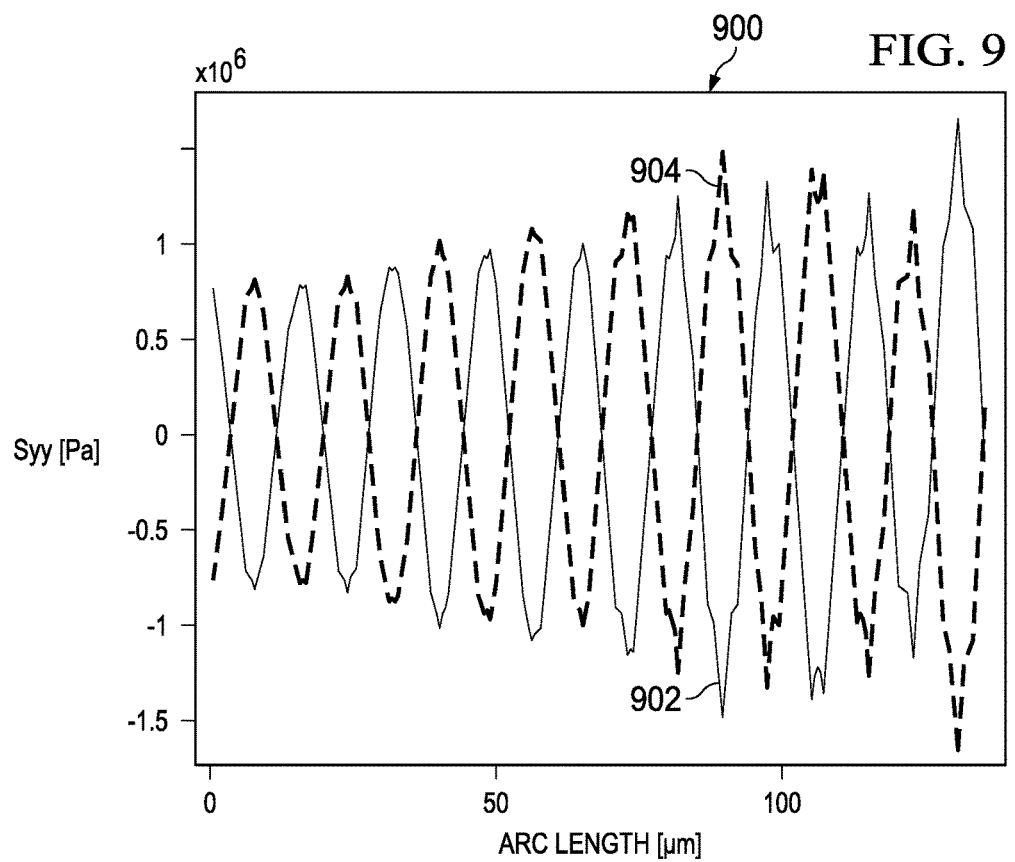
FIG. 9 is a diagram of an example pair of acoustic energy beams radiated by a balanced cavity region.

FIG. 9 is a diagram 900 of an example pair of acoustic energy beams radiated by a balanced cavity region (e.g., the cavity region 210). The diagram 900 shows steady-state stress distribution (Syy) in a vertical direction (e.g., the y-direction) along the acoustic energy flow in pascals as a function of arc length in microns. The diagram 900 includes curve 902 for a first acoustic energy beam (e.g., acoustic energy beam 640 of FIG. 6; and acoustic energy beam 750 of FIG. 7 and FIG. 8) of the pair of acoustic energy beams. The diagram 900 also includes curve 904 for a second acoustic energy beam (e.g., acoustic energy beam 650 of FIG. 6; and acoustic energy beam 760 of FIG. 7 and FIG. 8) of the pair of acoustic energy beams. In FIG. 9, a relative phase of the pair of acoustic energy beams radiated by the balanced cavity region is approximately 180 degrees out-of-phase.

Figure 10:
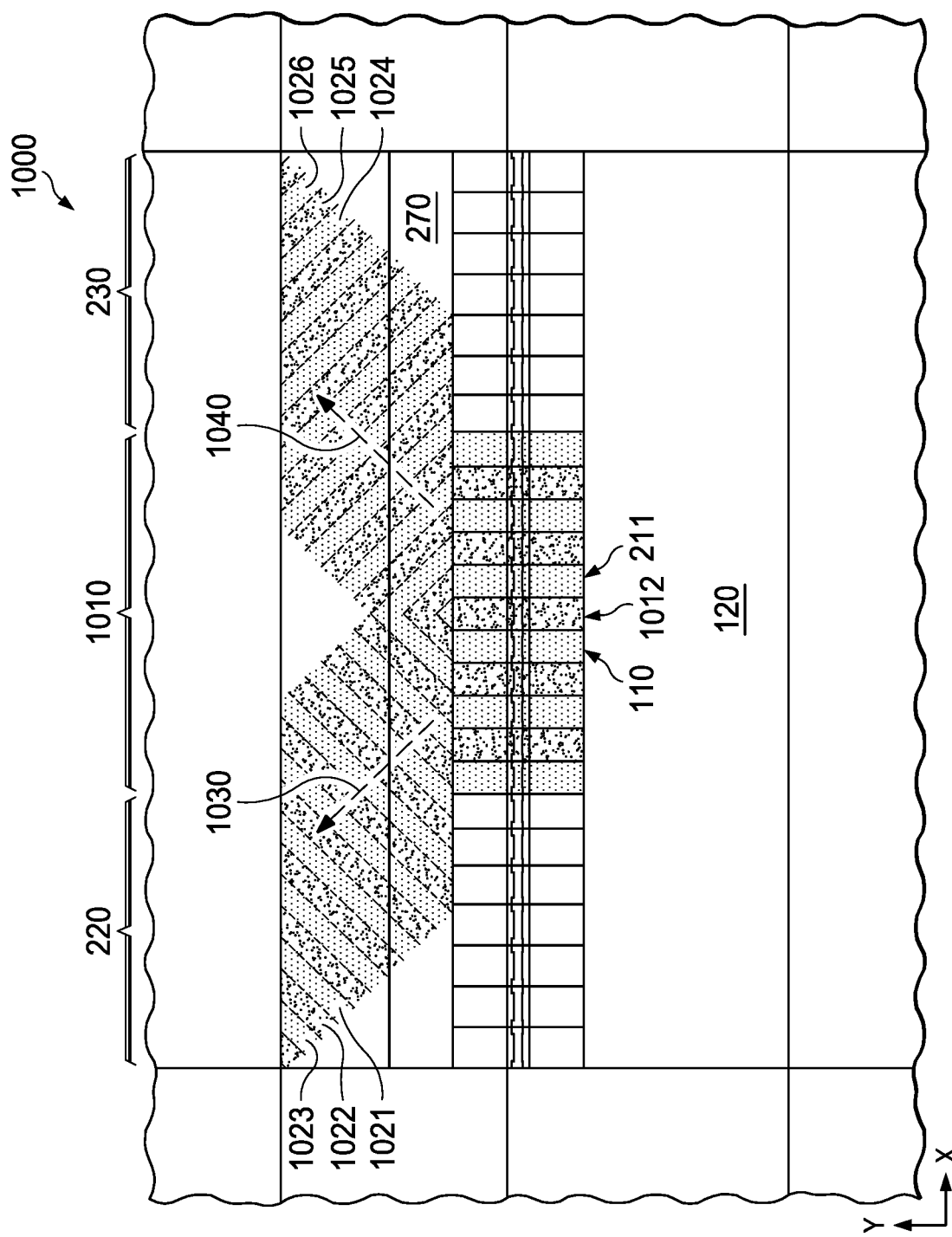
FIG. 10 is a cross-sectional view showing simulated operation of an example IC device that includes an unbalanced cavity region.

FIG. 10 is a cross-sectional view showing simulated operation of an IC device 1000 at a selected operating frequency of approximately 240 MHz. The IC device 1000 includes a cavity region 1010 formed by a linear array of transducer elements (e.g., transducer elements 110, 1012, and 211) across the substrate 120. The cavity region 1010 is bounded by the first termination region 220 and the second termination region 230. The cavity region 1010 can be identical or substantially identical to the cavity region 210 of FIG. 2 except for a transducer element 1012 being between transducer elements 110 and 211 in the cavity region 1010. With the transducer element 1012, the cavity region 210 includes eleven—an odd number—of transducer elements.

A cavity region (e.g., the cavity region 1010) having an odd number of transducer elements is an unbalanced cavity region. Similar to a balanced cavity region, neighboring transducer elements (e.g., transducer elements 1012 and 211) composing an unbalanced cavity region are adapted to be coupled to different excitation source terminals of a pair of excitation source terminals, and non-neighboring transducer elements (e.g., transducer elements 110 and 211) composing the unbalanced cavity region are adapted to be coupled to the same excitation source terminal of the pair of excitation source terminals. An unbalanced cavity region includes a greater number (e.g., six) of transducer elements that are adapted to be coupled to one excitation source terminal (e.g., the first excitation source terminal 321 of the pair of excitation source terminals 320) of a pair of excitation source terminals than a number (e.g., five) of transducer elements that are adapted to be coupled to another excitation source terminal (e.g., the second excitation source terminal 322) of the pair of excitation source terminals.

In FIG. 10, ferroelectric capacitors of transducer elements (e.g., transducer elements 110, 1012, and 211) forming the cavity region 1010 receive a differential pair of excitation signals (e.g., $V_{drive\_1}$ and $V_{drive\_2}$) having the selected operating frequency from an excitation source. The transducer elements forming the cavity 1010 are configured to, responsive to the ferroelectric capacitors receiving the differential pair of excitation signals, radiate acoustic energy that propagates in a vertical direction (e.g., the y-direction) away from the substrate 120. Signal wave elements 1021, 1022, 1023, 1024, 1025, and 1026 are representative of the radiated acoustic energy that propagates in the vertical direction. The radiated acoustic energy can be partitioned into a pair of acoustic energy beams (represented by arrows 1030 and 1040) that propagate in opposing lateral directions with respect to the vertical direction. Acoustic signal wave elements 1021, 1022, and 1023 compose a first acoustic beam 1030 of the pair of acoustic energy beams. Acoustic signal wave elements 1024, 1025, and 1026 compose a second acoustic beam 1040 of the pair of acoustic energy beams. In at least one example, acoustic signal wave elements (e.g., acoustic signal wave elements 1021, 1022, and 1023) composing an acoustic beam (e.g., the first acoustic beam 1030) of the pair of acoustic energy beams are analogous to alternating peaks and dips of a sine wave.

Figure 11:
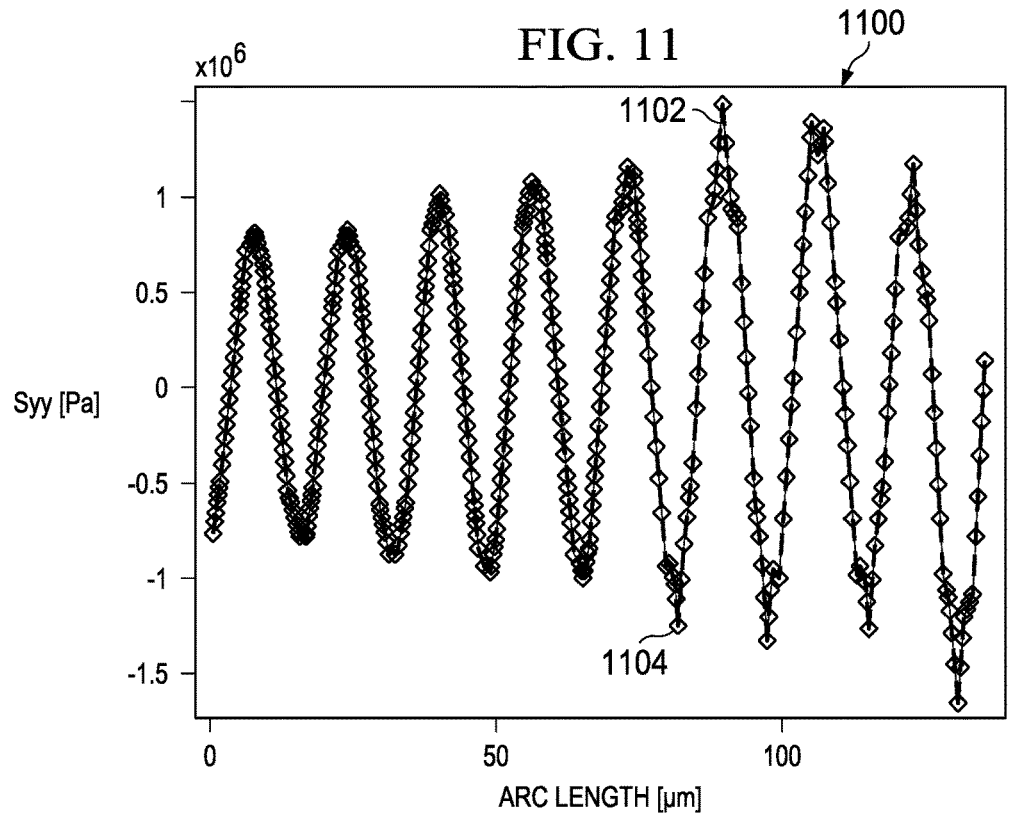
FIG. 11 is a diagram of an example pair of acoustic energy beams radiated by the unbalanced cavity region.

FIG. 11 is a diagram 1100 of an example pair of acoustic energy beams radiated by an unbalanced cavity region (e.g., the cavity region 1010). The diagram 1100 shows steady-state stress distribution (Syy) in a vertical direction (e.g., the y-direction) along the acoustic energy flow in pascals as a function of arc length in microns. The diagram 1100 includes curve 1102 for a first acoustic energy beam (e.g., acoustic energy beam 1030 of FIG. 10) of the pair of acoustic energy beams. The diagram 1100 also includes curve 1104 for a second acoustic energy beam (e.g., acoustic energy beam 1040 of FIG. 10) of the pair of acoustic energy beams. In FIG. 11, a relative phase of the pair of acoustic energy beams radiated by the unbalanced cavity region is in-phase.

A comparison between diagram 900 of FIG. 9 and diagram 1100 of FIG. 11, shows that one mechanism for altering a relative phase of a pair of acoustic energy beams radiated by a cavity region can involve varying relative numbers of transducer elements composing the cavity region that receive different excitation signals of a differential pair of excitation signals. Another mechanism for altering a relative phase of a pair of acoustic energy beams radiated by a cavity region can involve providing different phases of a same excitation signal composing a differential pair of excitation signals to non-neighboring transducer elements within a cavity region. For example, $V_{drive\_1}$ having a first phase offset (e.g., a 0° phase offset) can be provided to the transducer element 110 of the cavity region 1010, and $V_{drive\_1}$ having a second phase offset (e.g., a 20 phase offset) that is different from the first phase offset can be provided to the transducer element 211 of the cavity region 1010. Such mechanisms for altering a relative phase of a pair of acoustic energy beams radiated by a cavity region can facilitate beam steering functionalities.

FIG. 12 is a cross-sectional view of a portion of an example IC device 1200 that includes transducer elements 1210 and 1220 across the substrate 120. Transducer elements 1210 and 1220 can each be identical or substantially identical to the transducer element 110 of FIG. 1 in terms of geometric dimensions and structure except for transducer elements 1210 and 1220 each having a pitch 1230 that is larger than the pitch 186 of the transducer element 110. Transducer element 1210 includes the ferroelectric capacitor 141 and the third conductive element 155 of the transducer element 110 with the width 182 and the width 184, respectively. The IC device 1200 includes a separation distance 1240 in a lateral direction (e.g., the x-direction) between neighboring ferroelectric capacitors (e.g., ferroelectric capacitors 141 and 1250 of transducer elements 1210 and 1220, respectively) that is larger than a similar separation distance (e.g., a separation distance between the respective ferroelectric capacitors of transducer elements 110 and 211 in the IC device 100 of FIG. 2) of the IC device 100. In at least one example, the separation distance 1240 can be approximately 50 microns. That larger separation distance 1240 of the IC device 1200 provides transducer elements 1210 and 1220 with the pitch 1230 that is larger than the pitch 186 of the transducer element 110. That larger separation distance 1240 of the IC device 1200 also lowers an operating frequency or resonance frequency of the IC device 1200 relative to the operating frequency of the IC device 100 and facilitates Rayleigh surface acoustic mode operation by the IC device 1200.

Figure 13:
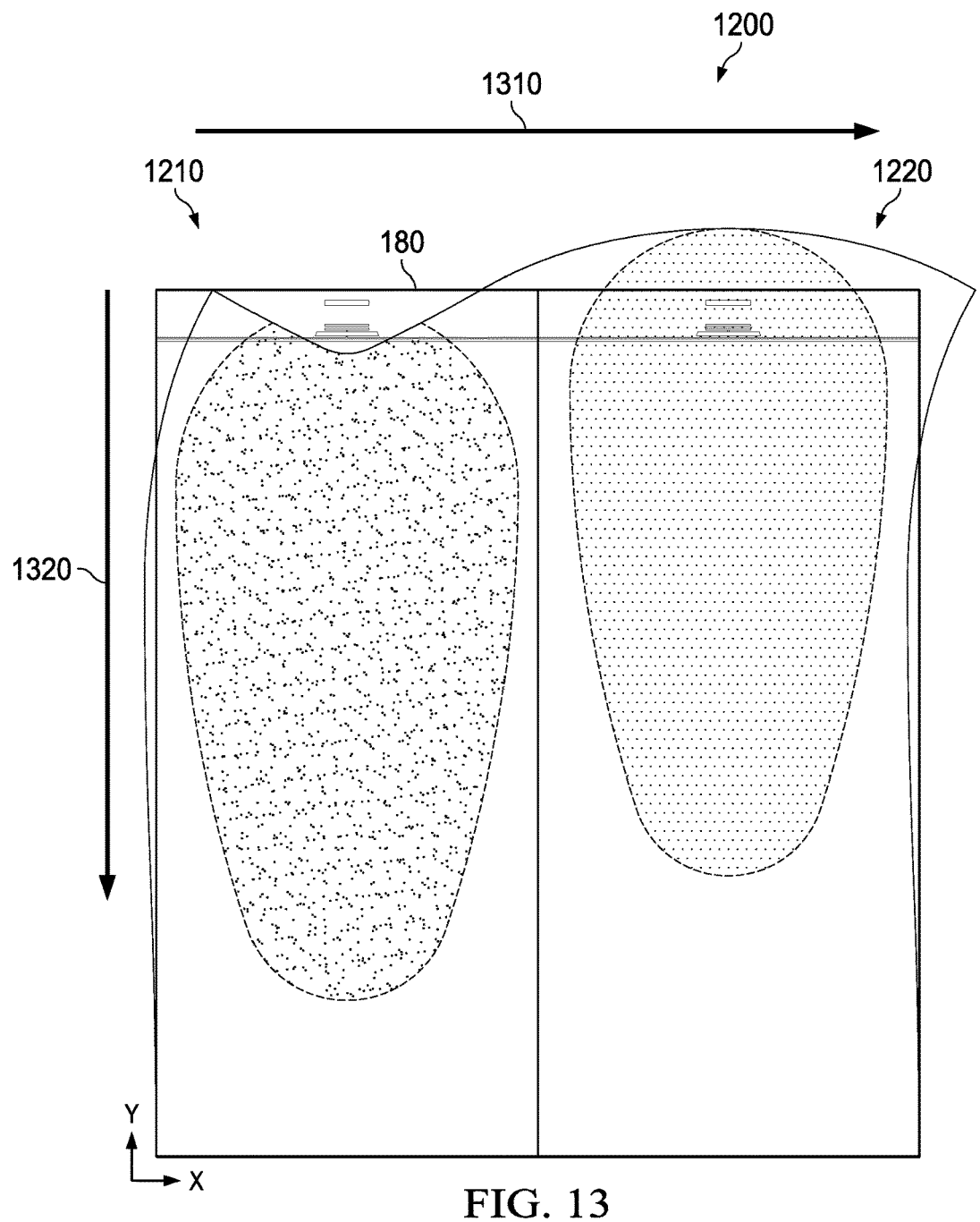
FIG. 13 is a cross-sectional view showing simulated operation of the portion of the IC device of FIG. 12 at a selected operating frequency of approximately 34 MHz.

FIG. 13 is a cross-sectional view showing simulated operation of the portion of the IC device 1200 that includes transducer elements 1210 and 1220 at a selected operating frequency of approximately 34 MHz. The selected operating frequency excites a resonance mode of a cavity region formed by transducer elements 1210 and 1220. Exciting the resonance mode of that cavity region induces a Rayleigh surface acoustic wave at the stack surface 180 of the IC device 1200. A wavelength of the Rayleigh surface acoustic wave inducible by exciting that resonance mode is A. Neighboring transducer elements (e.g., transducer elements 1210 and 1220) within the cavity region of the IC device 1200 formed by transducer elements 1210 and 1220 can be spaced at a pitch or periodicity of λ/2. Non-neighboring transducer elements (e.g., transducer element 1220 and a transducer element (not shown) positioned to laterally oppose (e.g., in the x-direction) transducer element 1220 with respect to the transducer element 1210) within the cavity region of the IC device 1200 formed by transducer elements 1210 and 1220 can be spaced at a pitch of λ. At the selected operating frequency, the Rayleigh surface acoustic wave propagates in a lateral direction (e.g., the x-direction) represented by arrow 1310 and elastic energy penetrates into the substrate 120 in a vertical direction (e.g., the y-direction) represented by arrow 1320. In at least one example, elastic energy penetrates into the substrate 120 in the vertical direction 1320 during Rayleigh surface acoustic mode operation by the IC device 1200 at a depth that is greater than a respective depth to which elastic energy penetrates into the substrate 120 of the IC device 100 responsive to exciting the resonance mode of the cavity region 210.

Figure 14:
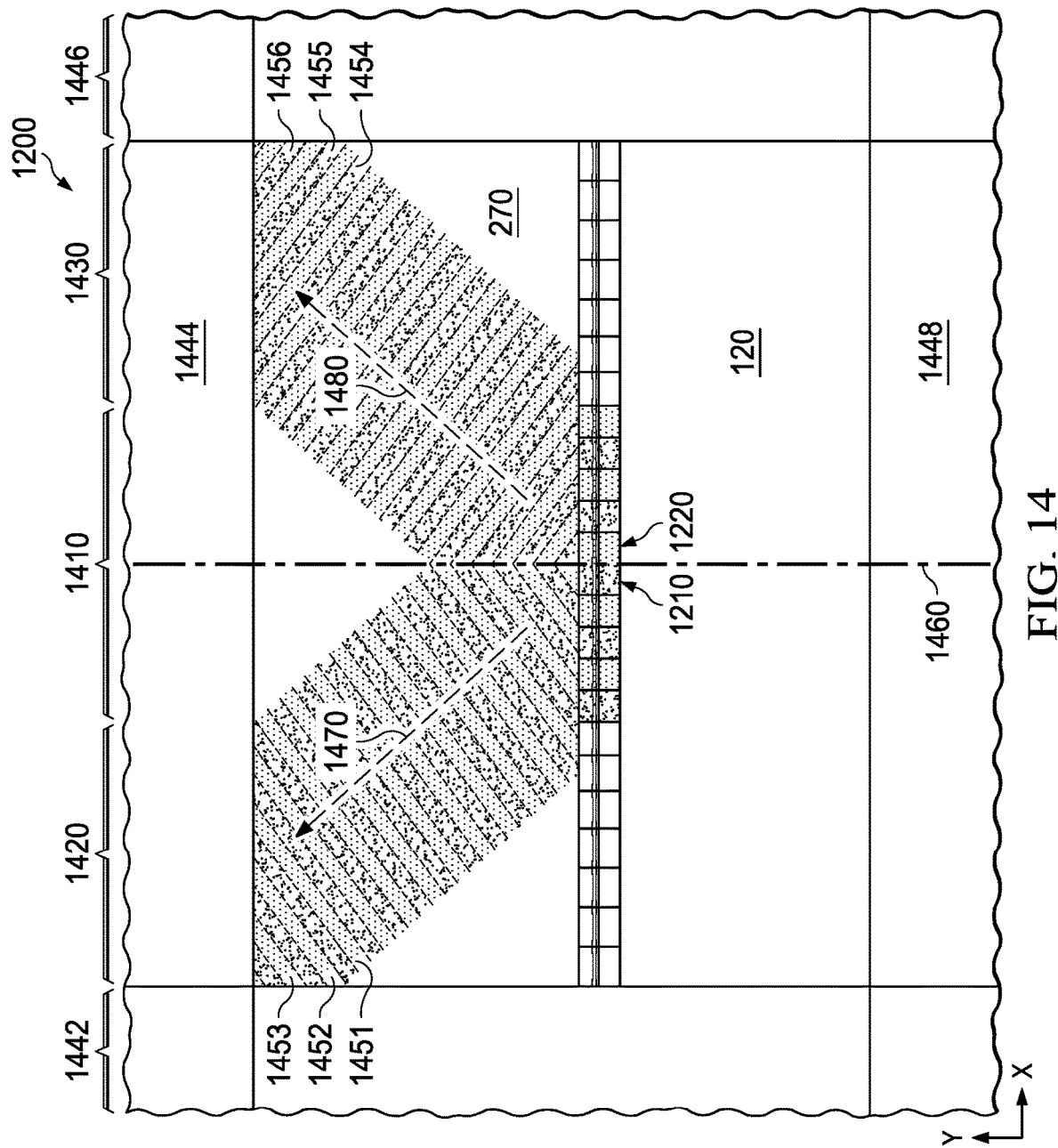
FIG. 14 is a cross-sectional view showing simulated operation of the IC device of FIG. 12 having a linear array of transducer elements across the substrate that facilitate Rayleigh surface acoustic mode operation.

FIG. 14 is a cross-sectional view showing simulated operation of the IC device 1200 at a selected operating frequency of approximately 34 MHz. The IC device 1200 includes a cavity region 1410 formed by a linear array of transducer elements (e.g., transducer elements 1210 and 1220) across the substrate 120. In FIG. 14, transducer elements 1210 and 1220 are representative of each transducer element that is in the cavity region 1410. Stated differently, each transducer element in the cavity region 1410 can be identical or substantially identical to transducer elements 1210 and 1220 in terms of geometric dimensions and structure.

The cavity region 1410 of the IC device 1200 is bounded by a first termination region 1420 and a second termination region 1430. The first termination region 1420 includes a first linear array of termination elements across the substrate 120. The second termination region 1430 includes a second linear array of termination elements across the substrate 120. Termination elements in the first termination region 1420 and the second termination region 1430 can be similar to transducer elements (e.g., transducer elements 1210 and 1220) within the cavity region 1410 in terms of geometric dimensions and structure. An acoustic impedance of each termination region (e.g., the first termination region 1420 and the second termination region 1430) can be different from an acoustic impedance of the cavity region 1410 such that an acoustic impedance mismatch exists between that termination region and the cavity region 1410. Creating an acoustic impedance mismatch between a given termination region and the cavity region 1410 can involve varying at least one geometric dimension (e.g., a width, a thickness, and/or a pitch) of a termination element composing the given termination region with respect to a corresponding geometric dimension of a transducer element composing the cavity region 1410.

For the simulated operation shown in FIG. 14, the IC device 1200 is bounded by regions 1442, 1444, 1446, and 1448 that represent PMLs. In FIG. 14, ferroelectric capacitors of transducer elements (e.g., transducer elements 1210 and 1220) forming the cavity region 1410 receive a differential pair of excitation signals (e.g., $V_{drive\_1}$ and $V_{drive\_2}$) having the selected operating frequency from an excitation source. The transducer elements forming the cavity 1410 are configured to, responsive to the ferroelectric capacitors receiving the differential pair of excitation signals, radiate acoustic energy that propagates in a vertical direction (e.g., the y-direction) away from the substrate 120. Signal wave elements 1451, 1452, 1453, 1454, 1455, and 1456 are representative of the radiated acoustic energy that propagates in the vertical direction. Constructive interference existing along a midline 1460 of the cavity region 1410 can partition the radiated acoustic energy into a pair of acoustic energy beams (represented by arrows 1470 and 1480) that propagate in opposing lateral directions with respect to the vertical direction. Acoustic signal wave elements 1451, 1452, and 1453 compose a first acoustic beam 1470 of the pair of acoustic energy beams. Acoustic signal wave elements 1454, 1455, and 1456 compose a second acoustic beam 1480 of the pair of acoustic energy beams. In at least one example, acoustic signal wave elements (e.g., acoustic signal wave elements 1451, 1452, and 1453) composing an acoustic beam (e.g., the first acoustic beam 1470) of the pair of acoustic energy beams are analogous to alternating peaks and dips of a sine wave.

Figure 15:
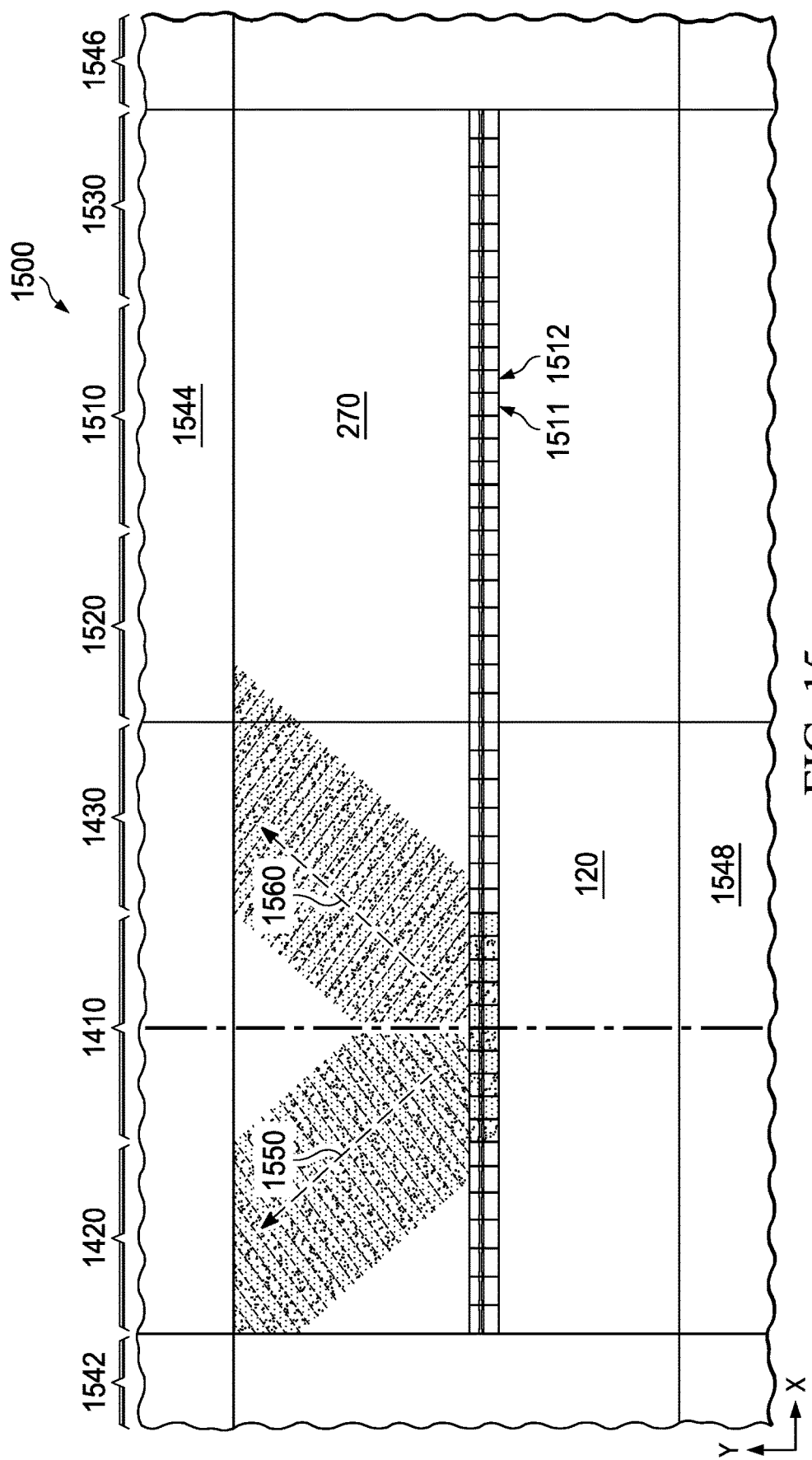
FIG. 15 is a cross-sectional view showing simulated operation of an example IC device having more than one linear array of transducer elements across the substrate and forming ultrasonic transducers that facilitate Rayleigh surface acoustic mode operation.
Figure 16:
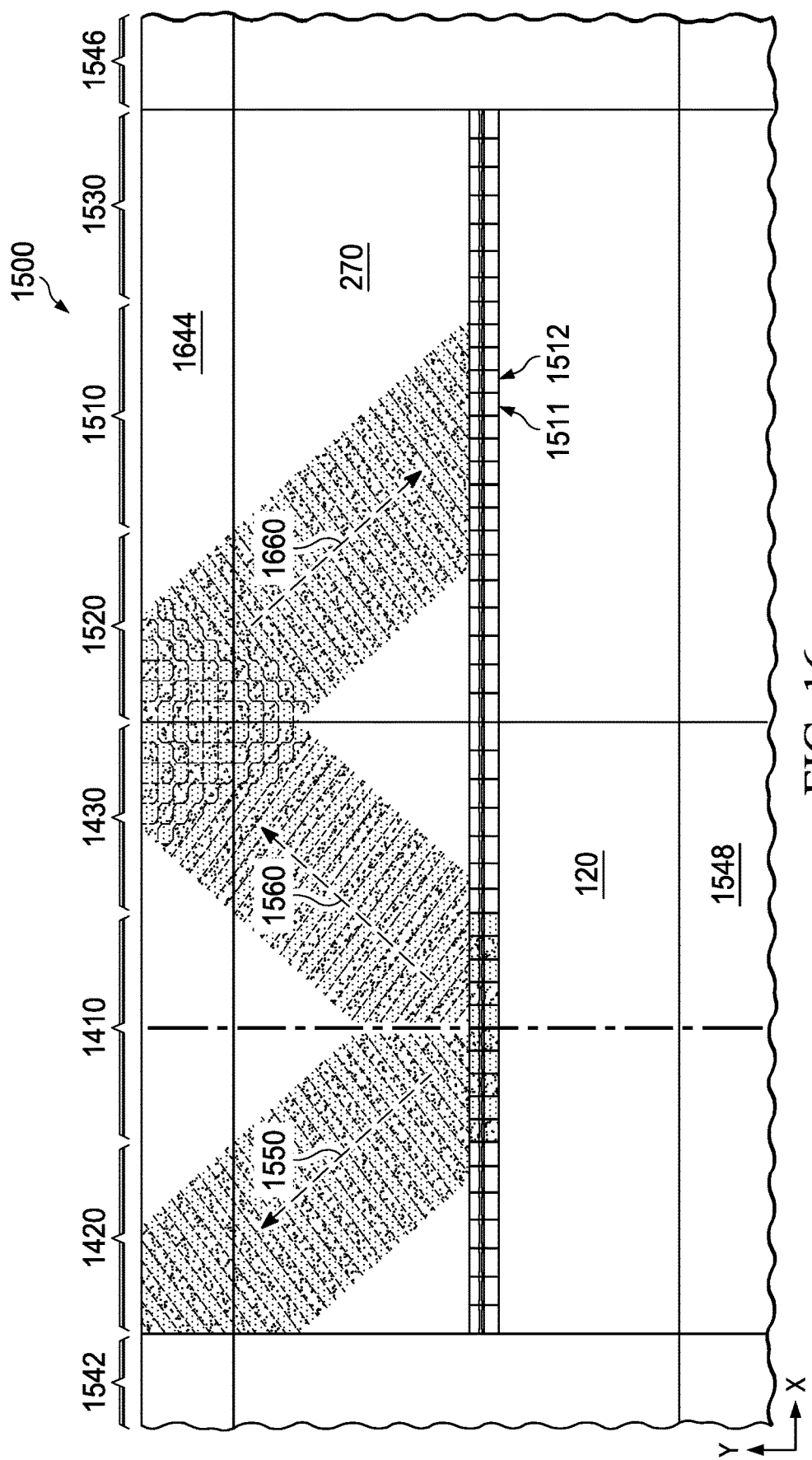
FIG. 16 is another cross-sectional view showing simulated operation of the IC device of FIG. 15.

FIG. 15 and FIG. 16 are cross-sectional views showing simulated operation of an example implementation of an IC device 1500 having more than one linear array of transducer elements across the substrate 120 and forming an ultrasonic transducer. The IC device 1500 includes the cavity region 1410 formed by a first linear array of transducer elements (e.g., transducer elements 1210 and 1220) across the substrate 120. The first linear array of transducer elements that form the cavity region 1410 are configured to operate in a transmit mode. The IC device 1500 also includes a second linear array of transducer elements (e.g., transducer elements 1511 and 1512) across the substrate 120 and forming a cavity region 1510. Each transducer element in the cavity region 1510 can be identical or substantially identical to transducer elements 1210 and 1220 of the cavity region 1410 in terms of geometric dimensions and structure. The second linear array of transducer elements that form the cavity region 1510 are configured to operate in a receive mode such that transducer elements within the cavity region 1510 convert acoustic energy into electrical energy representative of the acoustic energy. The cavity region 1510 of the IC device 1500 is bounded by a third termination region 1520 and a fourth termination region 1530. The third termination region 1520 and the fourth termination region 1530 can be identical or substantially identical to the first termination region 1420 and/or the second termination region 1430 in terms of geometric dimensions and structure.

For the simulated operation shown in FIG. 15, the IC device 1500 is bounded by regions 1542, 1544, 1546, and 1548 that represent PMLs. For the simulated operation shown in FIG. 16, the PML 1544 is replaced with a region 1644 that represents an FBC. In FIG. 15 and FIG. 16, ferroelectric capacitors of transducer elements forming the cavity region 1410 receive a differential pair of excitation signals (e.g., $V_{drive\_1}$ and $V_{drive\_2}$) having a selected operating frequency of approximately 34 MHz from an excitation source. The transducer elements forming the cavity 1410 are configured to, responsive to the ferroelectric capacitors receiving the differential pair of excitation signals, radiate acoustic energy that propagates in a vertical direction (e.g., the y-direction) away from the substrate 120. The radiated acoustic energy includes a pair of acoustic energy beams (represented by arrows 1550 and 1560) that propagate in opposing lateral directions with respect to the vertical direction. In FIG. 15, the PML 1544 absorbs all of the acoustic energy radiated by the transducer elements forming the cavity region 1410 such that none of that acoustic energy is reflected towards the transducer elements forming the cavity region 1510. In FIG. 16, the FBC 1644 reflects the acoustic energy radiated by the transducer elements forming the cavity region 1410 towards the transducer elements forming the cavity region 1510. The reflected acoustic energy includes an acoustic energy beam (represented by arrow 1660) that interacts with a stack surface of the transducer elements forming the cavity region 1510. The transducer elements forming the cavity region 1510 can convert the reflected acoustic energy into an electrical signal representative of the reflected acoustic energy. In at least one example, the electrical signal can be processed by CMOS circuitry (not shown) on the substrate 120. A comparison between FIG. 15 and FIG. 16 shows that the IC device 1500 is useful for performing sensor functions such as to detect the presence or absence of an object (e.g., a finger) proximate the packaging material 270. FIG. 15 represents a simulated operation responsive to the object being absent, and FIG. 16 represents a simulated operation responsive to the object being present.

Figure 17:
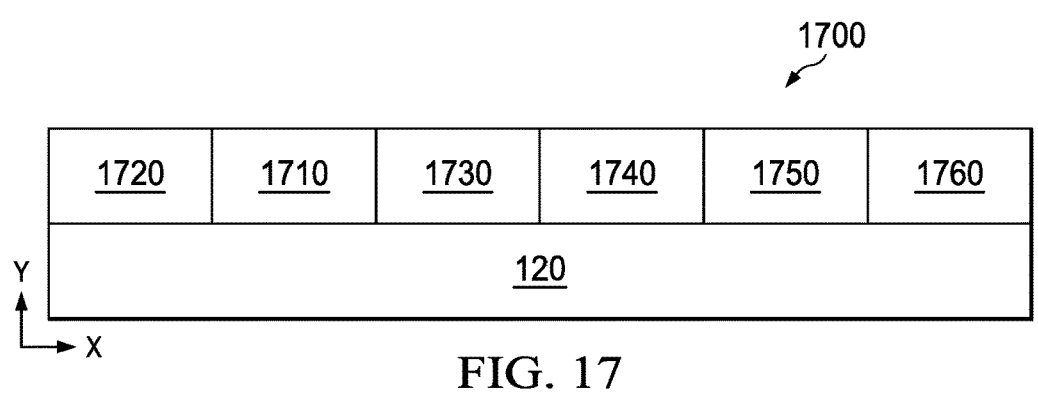
FIG. 17 is a block diagram of an example IC device having a linear array of transducer elements and electronic circuitry for controlling the linear array of transducer elements on the substrate.

FIG. 17 is a block diagram of an example IC device 1700 having an array of transducer elements and electronic circuitry for controlling that array on the substrate 120. The IC device 1700 includes a first cavity region 1710 that is laterally bounded (e.g., in the x-direction) by a first termination region 1720 and a second termination region 1730. The IC device 1700 also includes a second cavity region 1710 that is laterally bounded (e.g., in the x-direction) by the second termination region 1730 and a third termination region 1750. The first cavity region 1710 is formed by a first linear array of transducer elements across the substrate 120, and the second cavity region 1740 is formed by a second linear array of transducer elements across the substrate 120. In at least one example, the first linear array of transducer elements that form the first cavity region 1710 are configured to operate in a transmit mode, and the second linear array of transducer elements that form the second cavity region 1740 are configured to operate in a receive mode. In at least one example, the first linear array of transducer elements that form the first cavity region 1710 are configured to operate in a receive mode, and the second linear array of transducer elements that form the second cavity region 1740 are configured to operate in a transmit mode. In at least one example, the first cavity region 1710 and/or the second cavity region 1740 are implemented by the cavity region 210 of FIG. 2, the cavity region 510 of FIG. 5, the cavity region 1010 of FIG. 10, the cavity region 1410 of FIG. 14, and/or the cavity region 1510 of FIG. 15. In at least one example, the first termination region 1720, the second termination region 1730, and/or the third termination region 1750 are implemented by the first termination region 220 of FIG. 2, the second termination region 230 of FIG. 2, the third termination region 720 of FIG. 7, the fourth termination region 730 of FIG. 7, the first termination region 1420 of FIG. 14, the second termination region 1430 of FIG. 14, the third termination region 1520 of FIG. 15, and/or the fourth termination region 1530 of FIG. 15.

The IC device 1700 also includes electronic circuitry 1760 on the substrate 120 that is useful for controlling the first linear array of transducer elements forming the first cavity region 1710 and/or the second linear array of transducer elements forming the second cavity region 1740. In at least one example, the electronic circuitry 1760 includes an excitation source that provides Vbias, $V_{drive\_1}$, and/or $V_{drive\_2}$. In at least one example, the electronic circuitry 1760 includes processing circuitry that is useful for controlling electrical signals that are provided to a linear array of transducer elements (e.g., the first linear array of transducer elements forming the first cavity region 1710 and/or the second linear array of transducer elements forming the second cavity region 1740) that is configured to operate in a transmit mode. In at least one example, the electronic circuitry 1760 includes processing circuitry that is useful for evaluating electrical signals provided by a linear array of transducer elements (e.g., the first linear array of transducer elements forming the first cavity region 1710 and/or the second linear array of transducer elements forming the second cavity region 1740) that is configured to operate in a receive mode.

In this description, the term "couple" may cover connections, communications or signal paths that enable a functional relationship consistent with this description. For example, if device A generates a signal to control device B to perform an action, then: (a) in a first example, device A is directly connected to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components and forming the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources and forming the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:
a substrate; and
transducer elements over the substrate, each transducer element including a ferroelectric capacitor and a conductive element spaced from the ferroelectric capacitor by a dielectric material, the ferroelectric capacitor being between the conductive element and the substrate.

2. The device of claim 1, wherein:
the conductive element is a first conductive element;
the transducer element further includes a second conductive element between the first conductive element and the ferroelectric capacitor.

3. The device of claim 2, wherein the first conductive element is electrically isolated from an electrode of the ferroelectric capacitor.

4. The device of claim 2, wherein the first conductive element has a first width and the second conductive element has a second width that is equal to the first width.

5. The device of claim 1, further comprising:
a polysilicon layer between the substrate and the transducer elements, wherein the polysilicon layer is coupled to a ground terminal.

6. The device of claim 5, wherein the polysilicon layer is part of a front end of line (FEOL) structure.

7. The device of claim 1, wherein the ferroelectric capacitors of the transducer elements are first ferroelectric capacitors forming a cavity region, the device further comprising a first termination region including second ferroelectric capacitors and a second termination region including third ferroelectric capacitors, the first ferroelectric capacitors electrically coupled to an excitation source, and the second and third ferroelectric capacitors electrically isolated from the excitation source.

8. The device of claim 7, wherein the first termination region has a first acoustic impedance, and the cavity region has a second acoustic impedance that is different from the first acoustic impedance to form an acoustic impedance mismatch between the first termination region and the cavity region.

9. The device of claim 7, wherein the cavity region has an odd number of the transducer elements.

10. The device of claim 7, wherein the cavity region has an even number of the transducer elements.

11. The device of claim 7, wherein a wavelength of a surface acoustic wave inducible by exciting a resonance mode of the cavity region is $\lambda$; and neighboring transducer elements are spaced at a pitch of $\lambda/2$.

12. The device of claim 1, wherein the ferroelectric capacitor and the conductive element are in a metallization structure or a back end of line (BEOL) structure over the substrate.

13. The device of claim 1, wherein the conductive element is a first conductive element, and the transducer element further comprises a second conductive element over and electrically isolated from the first conductive element.

14. The device of claim 13, wherein the second conductive element has a same width as the first conductive element.

15. The device of claim 13, wherein the second conductive element has a different width from the first conductive element.

16. The device of claim 13, wherein the first and second conductive element and the ferroelectric capacitor are part of a metallization structure or a BEOL structure.

* * * * *